(12) United States Patent
Parvizi et al.

(10) Patent No.: US 11,561,570 B2
(45) Date of Patent: Jan. 24, 2023

(54) APPARATUS AND METHODS FOR LOW POWER FREQUENCY CLOCK GENERATION AND DISTRIBUTION

(71) Applicant: Ciena Corporation, Hanover, MD (US)

(72) Inventors: Mahdi Parvizi, Kanata (CA); Sadok Aouini, Gatineau (CA); Naim Ben-Hamida, Nepean (CA); Yuriy Greshishchev, Ottawa (CA); Douglas Stuart McPherson, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 17/108,152

(22) Filed: Dec. 1, 2020

(65) Prior Publication Data

US 2022/0171425 A1    Jun. 2, 2022

(51) Int. Cl.
| | |
|---|---|
| *G06F 1/08* | (2006.01) |
| *G06F 1/324* | (2019.01) |
| *G06F 7/68* | (2006.01) |
| *G06F 1/10* | (2006.01) |
| *H03B 19/10* | (2006.01) |
| *H03M 1/66* | (2006.01) |

(52) U.S. Cl.
CPC .............. *G06F 1/08* (2013.01); *G06F 1/10* (2013.01); *G06F 1/324* (2013.01); *G06F 7/68* (2013.01); *H03B 19/10* (2013.01); *H03M 1/66* (2013.01)

(58) Field of Classification Search
CPC ... H03B 19/10; G06F 1/08; G06F 1/04; G06F 1/10; G06F 1/06; H03M 1/66

USPC .......... 713/500, 501; 341/144; 327/116, 122
See application file for complete search history.

(56) References Cited

U.S. PATENT DOCUMENTS

| | | | |
|---|---|---|---|
| 5,864,246 A * | 1/1999 | Anderson .......... | H03K 5/00006 327/116 |
| 10,903,841 B1 * | 1/2021 | Parvizi ...................... | H03L 7/18 |
| 11,196,534 B1 * | 12/2021 | Parvizi .................. | H04L 7/0008 |
| 2005/0127973 A1 * | 6/2005 | Wyatt ..................... | H03L 7/183 327/238 |
| 2011/0122002 A1 | 5/2011 | Tsunoda | |

(Continued)

OTHER PUBLICATIONS

E. Monaco, M. Pozzoni, F. Svelto and A. Mazzanti, "Injection-Locked CMOS Frequency Doublers for $\mu$-Wave and mm-Wave Applications," in IEEE Journal of Solid-State Circuits, vol. 45, No. 8, pp. 1565-1574, Aug. 2010.

(Continued)

*Primary Examiner* — Ji H Bae
(74) *Attorney, Agent, or Firm* — Young Basile Hanlon & MacFarlane, P.C.

(57) ABSTRACT

Described are apparatus and methods for low power frequency clock generation and distribution. A device includes a low power generation and distribution circuit configured to generate and distribute a differential 1/N sampling frequency ($F_S$)($F_S$/N) clock, wherein N is larger or equal to 2, and a differential frequency doubler configured to generate a single-ended multiplied frequency clock from the differential $F_S$/N frequency clock, and convert the single-ended multiplied frequency clock to a differential multiplied frequency clock for use by one or more data processing channels.

20 Claims, 14 Drawing Sheets

(56) References Cited

U.S. PATENT DOCUMENTS

2019/0354134 A1* 11/2019 Cali .................. G06F 1/12

OTHER PUBLICATIONS

M. Parvizi, K. Allidina and M. N. El-Gamal, "An ultra-low power, low voltage CMOS squarer circuit for non-coherent IR-UWB receivers," in IEEE International Symposium on Circuits and Systems (ISCAS), Seoul, 2012, pp. 2533-2536.
Groen, Eric et al., "10-to-112-GB/s DSP-DAC-Based Transmitter in 7nm FinFET With Flex Clocking Architecture", IEEE Journal of Solid-State Circuits, IEEE, USA, vol. 56, No. 1, Nov. 26, 2020 (Nov. 26, 2020), pp. 30-42, XP011828799, ISSN: 0018-9200, DOI: 10.1109/JSCC.2020.3036981.
Farjad-Rad R. et al.," A 33-MW 8-GB/S CMOS Clock Multiplier and CDR for Highly Integrated I/OS", IEEE Journal of Solid-State Circuits, IEEE, USA, vol. 39, No. 9, Aug. 3, 3004 (Aug. 3, 2004), pp. 1553-1561, XP001224145, ISSN: 0018-9200, DOI: 10.1109/JSSC.2004.831457.
International Search Report in corresponding International Patent Application PCT/US2021/061383, dated Mar. 10, 2022, 4 pgs.

* cited by examiner

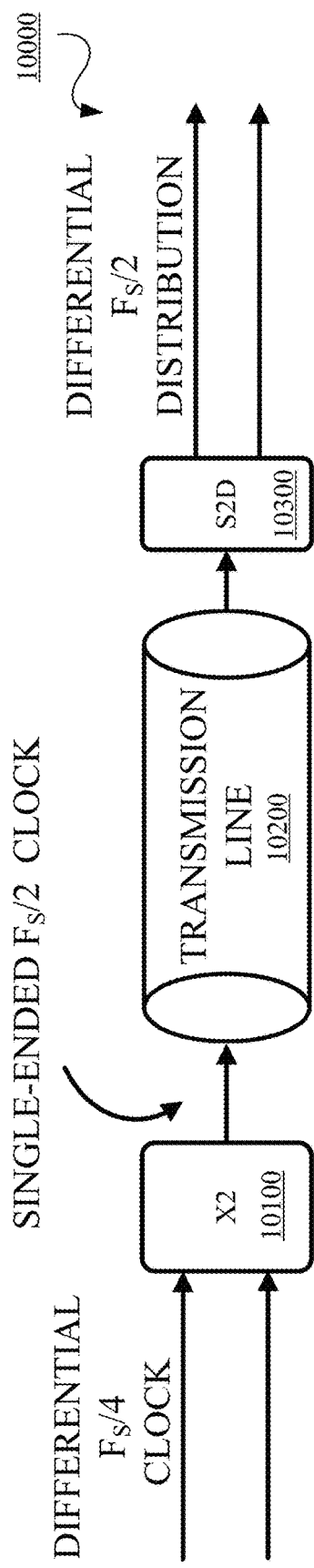
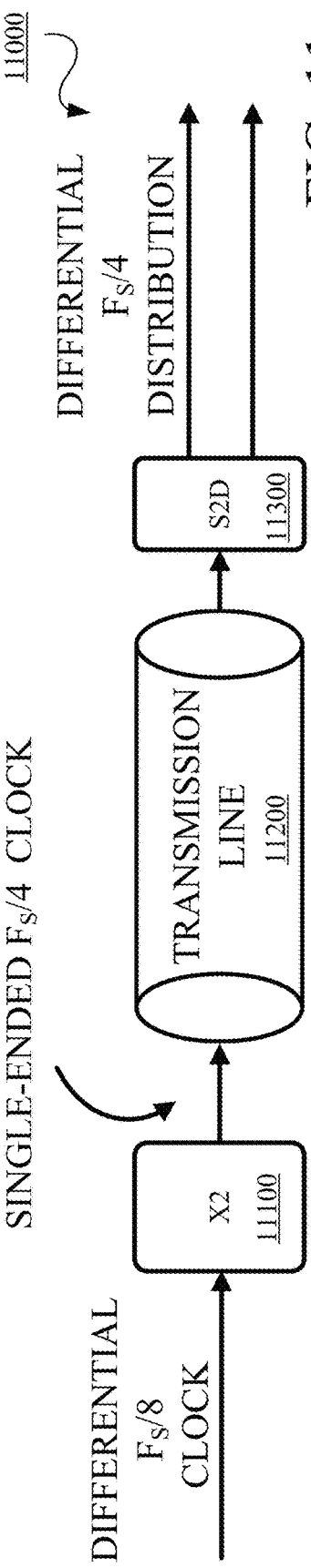
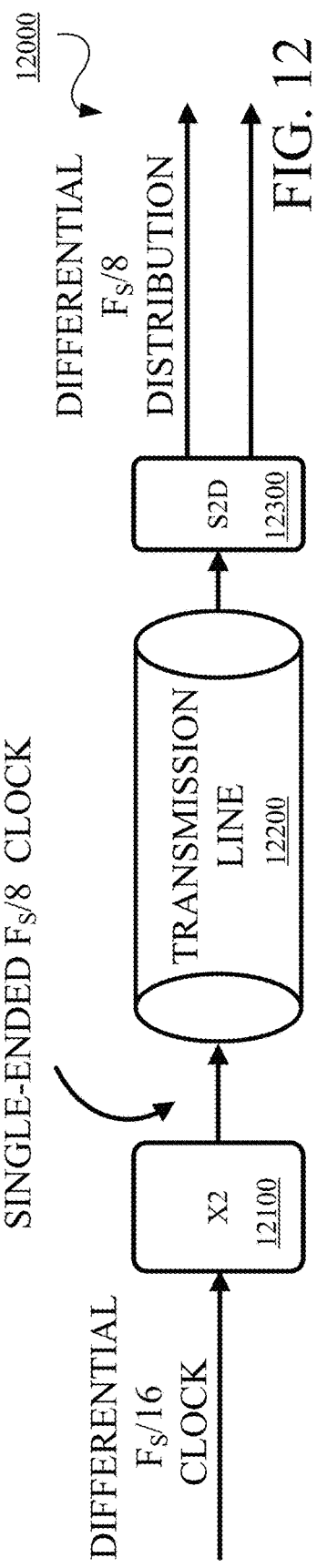

APPARATUS AND METHODS FOR LOW POWER FREQUENCY CLOCK GENERATION AND DISTRIBUTION

TECHNICAL FIELD

This disclosure relates to clock generation circuits. More specifically, this disclosure relates to low power frequency clock generation and distribution.

BACKGROUND

The need for higher frequency clocks in optical transceivers grows as the data rate in optical coherent modems increases. However, the capacity of semiconductor technologies optimized for high speed digital signal processing and data processing is lacking for generating spectrally pure high frequency clocks using direct generation techniques. Moreover, even if the technology is capable, the clock generation circuitry can be complex, the performance poor, and the power consumption high.

SUMMARY

Described herein are apparatus and methods low power frequency clock generation and distribution.

In implementations, a device includes a low power generation and distribution circuit configured to generate and distribute a differential 1/N sampling frequency $(F_S)(F_S/N)$ clock, wherein N is larger or equal to 2, and a differential frequency doubler configured to generate a single-ended multiplied frequency clock from the differential $F_S/N$ frequency clock, and convert the single-ended multiplied frequency clock to a differential multiplied frequency clock for use by one or more data processing channels.

In implementations, the differential frequency doubler comprising a squarer circuit implemented with one of a first transistor type or a second transistor type and a converter circuit implemented with a remaining one of a first transistor type or a second transistor type. In implementations, the differential frequency doubler comprising a squarer circuit implemented with one of a n-type metal-oxide-semiconductor (NMOS) transistor or a p-type metal-oxide-semiconductor (PMOS) transistor and a converter circuit implemented with a remaining one of the NMOS transistor or the PMOS transistor. In implementations, the differential frequency doubler is integrated with a data processing channel. In implementations, the differential frequency doubler is implemented at a terminal end of the low power generation and distribution circuit to feed multiple data processing channels. In implementations, the low power generation and distribution circuit includes another differential frequency doubler configured to generate a single-ended multiplied frequency clock from a differential $F_S/M$ frequency clock and convert the single-ended multiplied frequency clock to the differential $F_S/N$ frequency clock, wherein M is greater than N. In implementations, the low power generation and distribution circuit further comprises a phase locked loop operating at one of the $F_S/N$ frequency clock or the $F_S/M$ frequency clock, the phase locked loop configured to generate the $F_S/N$ frequency clock or the $F_S/M$ frequency clock from a reference clock. In implementations, the differential frequency doubler is multiple differential frequency doublers.

In implementations, a method for low power clock generation and distribution includes generating, by a clock generation circuit of a data processing device, a differential 1/N sampling frequency $(F_S)(F_S/N)$ clock, wherein N is larger or equal to 2, distributing, by a clock distribution circuit of the data processing device, the differential $F_S/N$ frequency clock, generating, by a squarer circuit, a single-ended frequency clock from the distributed differential $F_S/N$ frequency clock, and converting, by a converter, the single-ended frequency clock to a differential frequency clock for use at a data processing channel of the data processing device.

In implementations, the method further including implementing the squarer circuit with one of a first transistor type or a second transistor type, and implementing the converter with a remaining one of a first transistor type or a second transistor type. In implementations, the method further including implementing the squarer circuit with one of a n-type metal-oxide-semiconductor (NMOS) transistor or a p-type metal-oxide-semiconductor (PMOS) transistor, and implementing the converter with a remaining one of a n-type metal-oxide-semiconductor (NMOS) transistor or a p-type metal-oxide-semiconductor (PMOS) transistor. In implementations, the method further including implementing the squarer circuit and the converter in the data processing channel. In implementations, the generating by the clock generation circuit further including generating a single-ended frequency clock from a differential $F_S/M$ frequency clock, and converting the single-ended frequency clock based on the differential $F_S/M$ frequency clock to the differential $F_S/N$ frequency clock, wherein M is greater than N. In implementations, the generating by the clock generation circuit further including generating, by a phase locked loop, one of the FS/N frequency clock or the FS/M frequency clock from a reference clock.

In implementations, a method for clock generation and distribution, including generating, by a clock generation circuit of a data processing device, a 1/N sampling frequency $(F_S)(F_S/N)$ clock, wherein N is larger or equal to 2, generating, by a squarer circuit, a single-ended frequency clock from the differential $F_S/N$ frequency clock, distributing, by a clock distribution circuit of the data processing device, the single-ended frequency clock, and converting, by a converter, the distributed single-ended frequency clock to a differential frequency clock for use at a data processing channel of the data processing device.

In implementations, the method further including implementing the squarer circuit with one of a first transistor type or a second transistor type, and implementing the converter with a remaining one of a first transistor type or a second transistor type. In implementations, the method further including implementing the squarer circuit with one of a n-type metal-oxide-semiconductor (NMOS) transistor or a p-type metal-oxide-semiconductor (PMOS) transistor, and implementing the converter with a remaining one of a n-type metal-oxide-semiconductor (NMOS) transistor or a p-type metal-oxide-semiconductor (PMOS) transistor. In implementations, the method further including implementing the squarer circuit at the clock generation circuit, and implementing the converter at one of a terminal point of the clock distribution circuit or the data processing channel. In implementations, the generating by the clock generation circuit further including generating a single-ended frequency clock from a differential $F_S/M$ frequency clock, and converting the single-ended frequency clock based on the differential $F_S/M$ frequency clock to the differential $F_S/N$ frequency clock, wherein M is greater than N. In implementations, the generating by the clock generation circuit further including generating, by a phase locked loop, one of the $F_S/N$ frequency clock or the $F_S/M$ frequency clock from a reference clock.

In implementations, a device includes a clock generation circuit configured to generate a 1/N sampling frequency (FS)(FS/N) clock, wherein N is larger or equal to 2, a squarer circuit configured to generate a single-ended frequency clock from the differential FS/N frequency clock, a clock distribution circuit configured to distribute the single-ended frequency clock, and a converter configured to convert the distributed single-ended frequency clock to a differential frequency clock for use at a data processing channel of the data processing device.

In implementations, the squarer circuit comprises one of a first transistor type or a second transistor type, and the converter comprises a remaining one of a first transistor type or a second transistor type. In implementations, the squarer circuit comprises one of a n-type metal-oxide-semiconductor (NMOS) transistor or a p-type metal-oxide-semiconductor (PMOS) transistor, and the converter comprises a remaining one of a n-type metal-oxide-semiconductor (NMOS) transistor or a p-type metal-oxide-semiconductor (PMOS) transistor. In implementations, the squarer circuit is implemented at the clock generation circuit, and the converter is implemented at one of a terminal point of the clock distribution circuit or the data processing channel. In implementations, the clock generation circuit further configured to generate a single-ended frequency clock from a differential FS/M frequency clock, and convert the single-ended frequency clock based on the differential FS/M frequency clock to the differential FS/N frequency clock, wherein M is greater than N. In implementations, the clock generation circuit further comprises a phase locked loop configured to generate one of the FS/N frequency clock or the FS/M frequency clock from a reference clock.

BRIEF DESCRIPTION OF THE DRAWINGS

The disclosure is best understood from the following detailed description when read in conjunction with the accompanying drawings. It is emphasized that, according to common practice, the various features of the drawings are not to scale. On the contrary, the dimensions of the various features are arbitrarily expanded or reduced for clarity.

FIG. 10 is a block diagram of an example of a single-ended frequency clock generation and distribution circuit in accordance with embodiments of this disclosure.

FIG. 11 is a block diagram of an example of a single-ended frequency clock generation and distribution circuit in accordance with embodiments of this disclosure.

FIG. 12 is a block diagram of an example of a single-ended frequency clock generation and distribution circuit in accordance with embodiments of this disclosure.

DETAILED DESCRIPTION

Figure 1:
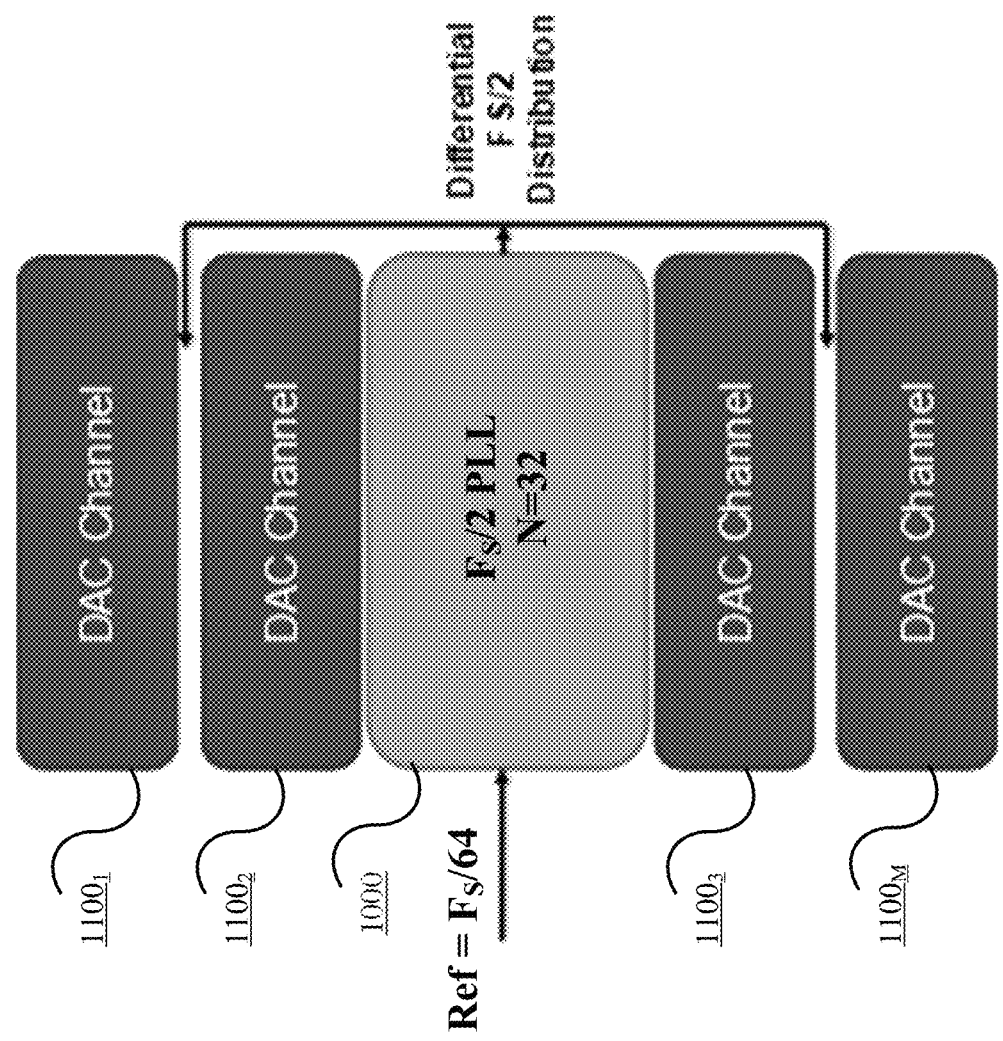
FIG. 1 is a block diagram of a phase locked loop having a high divide ratio.

Reference will now be made in greater detail to embodiments of the invention, examples of which are illustrated in the accompanying drawings. Wherever possible, the same reference numerals will be used throughout the drawings and the description to refer to the same or like parts.

As used herein, the terminology "computer" or "computing device" includes any unit, or combination of units, capable of performing any method, or any portion or portions thereof, disclosed herein. The computer or computing device may include a processor.

As used herein, the terminology "processor" indicates one or more processors, such as one or more special purpose processors, one or more digital signal processors, one or more microprocessors, one or more controllers, one or more microcontrollers, one or more application processors, one or more central processing units (CPU)s, one or more graphics processing units (GPU)s, one or more digital signal processors (DSP)s, one or more application specific integrated circuits (ASIC)s, one or more application specific standard products, one or more field programmable gate arrays, any other type or combination of integrated circuits, one or more state machines, or any combination thereof.

As used herein, the terminology "memory" indicates any computer-usable or computer-readable medium or device that can tangibly contain, store, communicate, or transport any signal or information that may be used by or in connection with any processor. For example, a memory may be one or more read-only memories (ROM), one or more random access memories (RAM), one or more registers, low power double data rate (LPDDR) memories, one or more cache memories, one or more semiconductor memory devices, one or more magnetic media, one or more optical media, one or more magneto-optical media, or any combination thereof.

As used herein, the terminology "instructions" may include directions or expressions for performing any method, or any portion or portions thereof, disclosed herein, and may be realized in hardware, software, or any combination thereof. For example, instructions may be implemented as information, such as a computer program, stored in memory that may be executed by a processor to perform any of the respective methods, algorithms, aspects, or combinations thereof, as described herein. Instructions, or a portion thereof, may be implemented as a special purpose processor, or circuitry, that may include specialized hardware for carrying out any of the methods, algorithms, aspects, or combinations thereof, as described herein. In some implementations, portions of the instructions may be distributed across multiple processors on a single device, on multiple devices, which may communicate directly or across a network such as a local area network, a wide area network, the Internet, or a combination thereof.

As used herein, the term "application" refers generally to a unit of executable software that implements or performs one or more functions, tasks or activities. The unit of executable software generally runs in a predetermined environment and/or a processor.

As used herein, the terminology "determine" and "identify," or any variations thereof includes selecting, ascertaining, computing, looking up, receiving, determining, establishing, obtaining, or otherwise identifying or determining in any manner whatsoever using one or more of the devices and methods are shown and described herein.

As used herein, the terminology "example," "the embodiment," "implementation," "aspect," "feature," or "element" indicates serving as an example, instance, or illustration. Unless expressly indicated, any example, embodiment, implementation, aspect, feature, or element is independent of each other example, embodiment, implementation, aspect, feature, or element and may be used in combination with any other example, embodiment, implementation, aspect, feature, or element.

As used herein, the terminology "or" is intended to mean an inclusive "or" rather than an exclusive "or." That is unless specified otherwise, or clear from context, "X includes A or B" is intended to indicate any of the natural inclusive permutations. That is if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from the context to be directed to a singular form.

Further, for simplicity of explanation, although the figures and descriptions herein may include sequences or series of steps or stages, elements of the methods disclosed herein may occur in various orders or concurrently. Additionally, elements of the methods disclosed herein may occur with other elements not explicitly presented and described herein. Furthermore, not all elements of the methods described herein may be required to implement a method in accordance with this disclosure. Although aspects, features, and elements are described herein in particular combinations, each aspect, feature, or element may be used independently or in various combinations with or without other aspects, features, and elements.

Further, the figures and descriptions provided herein may be simplified to illustrate aspects of the described embodiments that are relevant for a clear understanding of the herein disclosed processes, machines, manufactures, and/or compositions of matter, while eliminating for the purpose of clarity other aspects that may be found in typical similar devices, systems, compositions and methods. Those of ordinary skill may thus recognize that other elements and/or steps may be desirable or necessary to implement the devices, systems, compositions and methods described herein. However, because such elements and steps are well known in the art, and because they do not facilitate a better understanding of the disclosed embodiments, a discussion of such elements and steps may not be provided herein. However, the present disclosure is deemed to inherently include all such elements, variations, and modifications to the described aspects that would be known to those of ordinary skill in the pertinent art in light of the discussion herein.

A challenge in high-speed digital to analog converter (DAC) design is the need for $F_S/2$ clocks for the final data interleaving or multiplexing stages. For example, an 800 GHz coherent optical communications link may have a sampling rate ($F_S$) of the order of 120 Gs/s, with the final multiplexer stage selecting alternate data streams on the rising and falling edge of a clock that is half the output sampling rate ($F_S/2$), or 60 GHz. A conventional technique is to use a voltage-controlled oscillator (VCO) with a center frequency of $F_S/2$ and build a phase-locked loop (PLL) around it. This PLL is locked to a clock reference such as a clock multiplied quartz crystal. The highest frequency that conventional low jitter reference clocks can reach is approximately 2 GHz. To clock multiply this reference to the $F_S/2$ center frequency requires a large divide ratio in the PLL feedback path. FIG. 1 is a block diagram of an example of a phase locked loop 1000 having a high divide ratio. As shown, a reference $F_S/M$ clock is input into the PLL 1000 which has a large divide ratio of N=M/2. For example, M can be 64. Accordingly, the output of the PLL 1000 is a $F_S/2$ clock which is distributed to the DAC channels $1100_{1-M}$. The use of a large divide ratio results in a decrease in PLL bandwidth which leads to a reduction in the suppression of the VCO noise and an increase in the jitter contribution of the charge pump (CP), frequency divider (FD), and phase frequency detector (PFD). That is, for example, the larger the divide ratio the higher the jitter performance of the PLL In addition, the VCO design at $F_S/2$ frequencies using semiconductor technology developed for low-power digital applications (~60 GHz) is very difficult due to the low-quality factor (Q factor) of the inductors, capacitors, and varactors that form the resonator of the oscillator. In combination with the inherent noise generated by the switching transistors in the VCO, the Q factor of the resonator define the VCOs phase noise. The Q factor and the transistor noise increase at an ever-increasing rate as the center frequency increases. If this degradation did not occur, two VCOs at different center frequencies would have the same normalized phase noise. Since this is not the case and the normalized performance of the lower frequency VCO is superior to that of the higher frequency VCO, clock multiplication is an attractive technique to circumvent the semiconductor technologies limitations.

A frequency doubler at the output of the PLL can be used to reduce the divide ratio in a PLL and permit the use of an $F_S/4$ VCO. Conventional frequency doubling techniques use frequency doublers that produce a single phase of the doubled clock from two phases of the half frequency clock (clock & clockb at $F_S/4$). These frequency doubling techniques use a combination of p-type metal-oxide-semiconductor (PMOS) and n-type metal-oxide-semiconductor (NMOS) transistors to generate the complementary outputs. A disadvantage of creating complementary doubled clocks (a clock pair) using this technique is that the resulting clock pair have large phase and amplitude mismatch. In addition, the NMOS and PMOS devices generate differential signals that have significant asymmetry between the differential outputs over process corners. When the PMOS and NMOS devices differ in speed and/or transducer gain, the differential outputs are skewed in time with respect to each other, the amplitudes are mismatched, and the duty cycle distortion (DCD) of the outputs degrade switching performance of the final interleaving or multiplexer stage in the DAC. Since differential clocks and their character directly affect the DAC performance, circuits that only create single-ended $F_S/4$ outputs are of little practical use.

Described herein are apparatus, devices, circuits, systems, and methods for low power frequency clock generation and distribution. In implementations, a PLL operating at a frequency of $F_S/4$ or lower is connected to one or more differential frequency doublers (DFD(s)). Each DFD includes a multiplier circuit and a single-ended to differential (S2D) circuit. The multiplier circuit doubles a differential clock input to generate a doubled single-ended clock output. The S2D circuit converts the doubled single-ended clock output to a differential clock output. The DFD is a low power and low complexity frequency multiplying circuit and allows clocks to be generated at a lower frequency before doubling it. The DFD enables simplification of the PLLs, reduces the clock jitter, and produces a fully differential $F_S/2$ frequency clock at an output of the DFD with 50% duty cycle when the input is a differential $F_S/4$ frequency clock, for example. The DFDs described herein occupy a low area relative to the data processing device or a data processing channel.

In implementations, a DFD is located at a data processing channel to enable local clock generation. In implementations, a DFD is located at a distribution terminal point or end in the clock distribution circuit to service multiple data processing channels. In implementations, a DFD is located in the clock generation circuit to enable a PLL to operate at a $F_S/8$ or lower frequency clock. In implementations, DFDs are located in the clock generation circuit, the clock distribution circuit, or both. In implementations, a multiplier circuit and a S2D circuit can be distributed between a distribution origin point and the distribution terminal point (a "distributive DFD"). The distributive DFD enables single-ended frequency clock distribution. Reducing the frequency clock and power in clock distribution circuits is beneficial as data rates in data processing devices increase and driving long transmission-lines with 50Ω termination becomes more challenging.

In implementations, the use of DFDs foregoes the need of differential in-phase and quadrature clocks as used in prior designs. The need to generate quadrature clocks makes the prior designs power consuming and limited to the frequency that the quadrature generation block can operate. Furthermore, the quadrature generation block requires startup procedures which make the test and bring-up more time consuming. The drawbacks of relying on quadrature clocks to generate double the frequency are the complexity, area, and power consumption of the quadrature generator. These issues limit the usage of these types of doublers. For example, prior devices require quadrature clocks at the input of the frequency doublers to produce balance differential outputs at twice the frequency. The DFDs herein reduce the area and power consumption by avoiding quadrature correction. The DFDs use differential clocks at the input of the doubler and produce a single-ended output running at twice the frequency. The single-ended output enters a compact single-ended to differential converter to produce the fully balanced outputs. The DFD circuits described herein are immune from common-mode noises. The DFD uses two phases (differential) inputs and produces differential outputs at twice the frequency.

Figure 2:
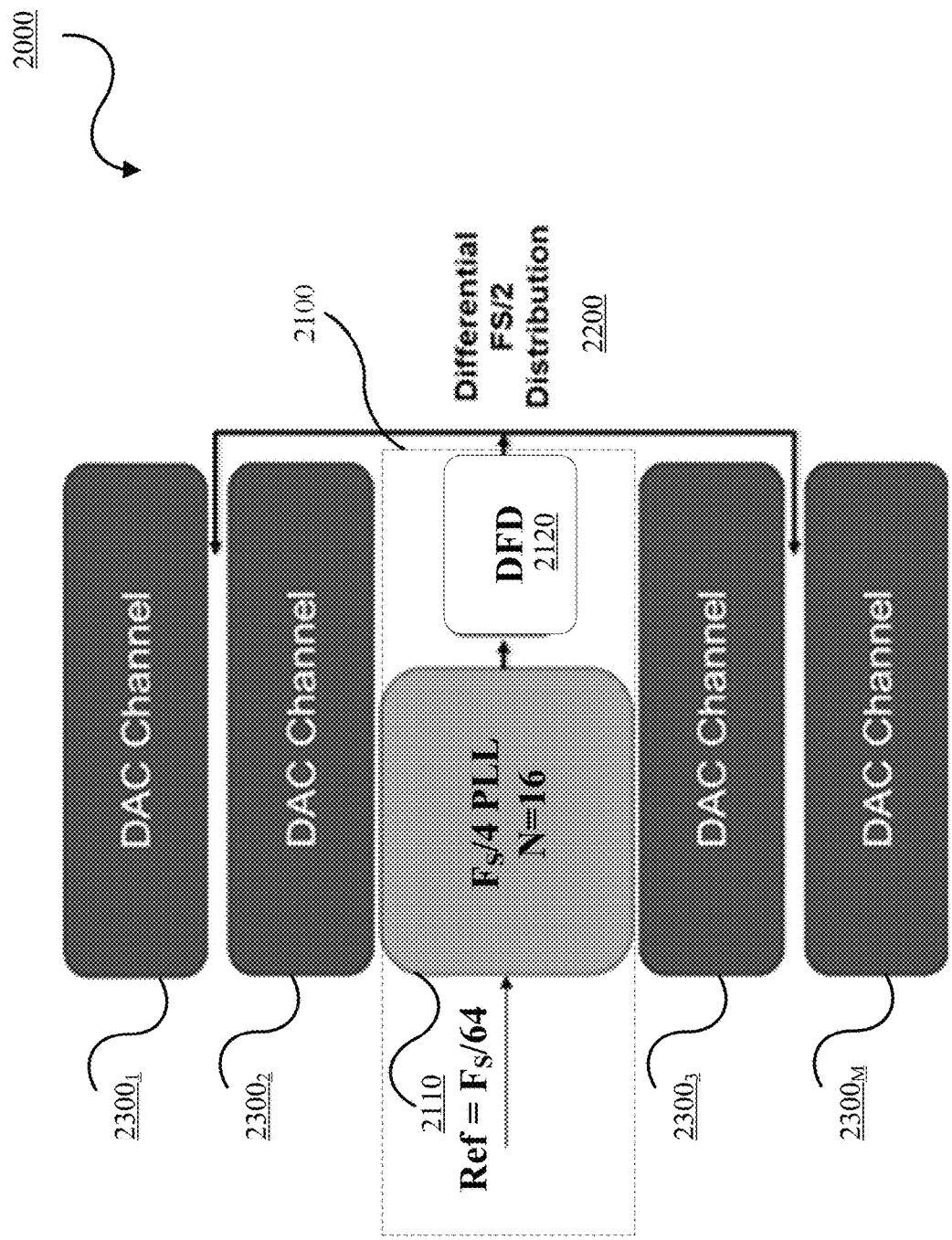
FIG. 2 is a block diagram of a phase locked loop and clock multiplication with high frequency clock distribution in accordance with embodiments of this disclosure.

FIG. 2 is a block diagram of an example of a frequency clock generation and distribution architecture for a multi-channel high speed device 2000. In implementations, the multi-channel high speed device 2000 can be a multi-channel digital-to-analog converter (DAC), a multi-channel serializer, and the like. The multi-channel high speed device 2000 includes a frequency clock generation circuit 2100 which is connected to a frequency clock distribution circuit 2200, which in turn is connected to multiple data processing channels such as DAC channels $2300_1$, $2300_2$, ..., $2300_M$. The frequency clock generation circuit 2100 includes a PLL 2110 which operates at and generates a frequency clock from a reference clock (Ref) and a DFD 2120 which generates a doubled frequency clock for distribution over the frequency clock distribution circuit 2200. The PLL 2110 can be a $F_S/4$ voltage controlled oscillator (VCO) which has a lower normalized jitter than an $F_S/2$ equivalent and reduces the PLL feedback divide ratio by a factor of 2. In implementations, the frequency clock is a $F_S/4$ frequency clock. Consequently, a divide ratio in the PLL 2110 is 16. In implementations, the frequency clock can be at least a $F_S/4$ or lower frequency clock. In implementations, the frequency clock can be at least a differential $F_S/4$ or lower frequency clock. In implementations, the reference clock is a high precision external reference clock.

Operationally, the PLL 2110 generates a differential $F_S/4$ frequency clock which is doubled by the DFD 2120 to output a differential $F_S/2$ frequency clock. The DFD 4120 multiplies the differential $F_S/4$ frequency clock inputs to output a single-ended $F_S/2$ frequency clock and then converts the single-ended $F_S/2$ frequency clock to a differential $F_S/2$ frequency clock for distribution by the frequency clock distribution circuit 2200 for use by the DAC channels $2300_1$, $2300_2$, ..., $2300_M$. Quadrature frequency clock generation, quadrature correction, and the like are not needed.

Figure 3:
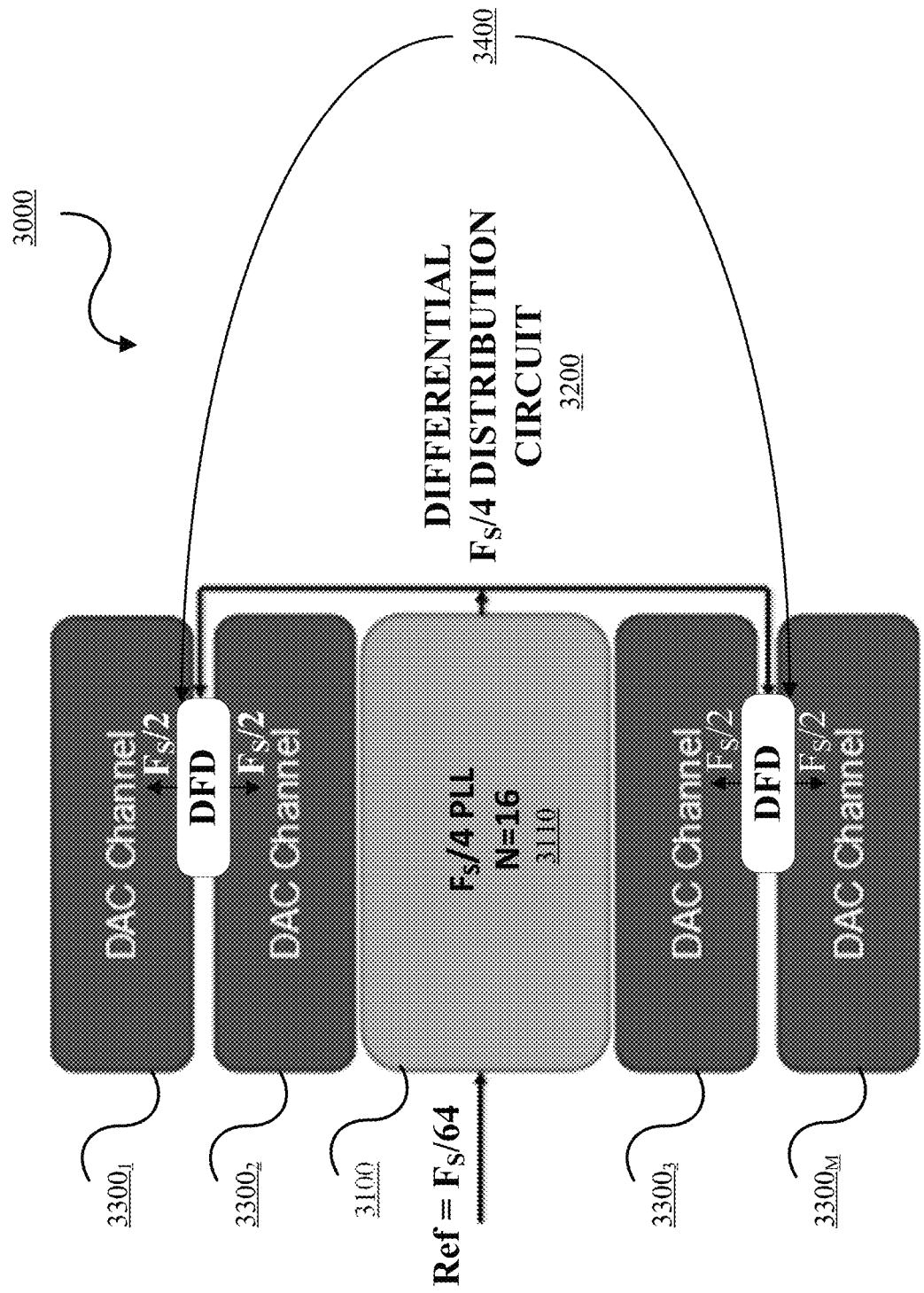
FIG. 3 is a block diagram of an example of a frequency clock generation and distribution architecture for a multi-channel high speed device in accordance with embodiments of this disclosure.

FIG. 3 is a block diagram of an example of a frequency clock generation and distribution architecture for a multi-channel high speed device 3000. In implementations, the multi-channel high speed device 3000 can be a multi-channel digital-to-analog converter (DAC), a multi-channel serializer, and the like. The multi-channel high speed device 3000 includes a frequency clock generation circuit 3100 which is connected to or in communication with (collectively "connected to") a frequency clock distribution circuit 3200, which in turn is connected to multiple data processing channels such as DAC channels $3300_1$, $3300_2$, ..., $3300_M$. The frequency clock generation circuit 3100 includes a PLL 3110 which operates at and generates a frequency clock from a reference clock (Ref). In implementations, the frequency clock is a $F_S/4$ frequency clock. Consequently, a divide ratio in the PLL 3110 is 16. In implementations, the frequency clock can be at least a $F_S/4$ or lower frequency clock. In implementations, the frequency clock can be at least a differential $F_S/4$ or lower frequency clock. In implementations, the reference clock is a high precision external reference clock.

The multi-channel high speed device 3000 further includes DFDs 3400 to generate the $F_S/2$ frequency clocks after clock distribution, which are then used by each of the data processing channels. In implementations, the DFDs 3400 enable local or near local frequency multiplication at the DAC channels $3300_1$, $3300_2$, ..., $3300_M$. In implementations, the frequency clock distribution circuit 3200 includes the DFDs 3400 so that multiple channels of the DAC channels $3300_1, 3300_2, \ldots, 3300_M$ can use one DFD 3400. In implementations, each of the DAC channels $3300_1, 3300_2, \ldots, 3300_M$ includes a DFD 3400.

Operationally, the PLL 3110 generates a differential $F_S/4$ frequency clock which is then distributed by the frequency clock distribution circuit 3200. The DFDs 3400 multiply the differential $F_S/4$ frequency clock inputs to output a single-ended $F_S/2$ frequency clock and then convert the single-ended $F_S/2$ frequency clock to a differential $F_S/2$ frequency clock for use by the DAC channels $3300_1, 3300_2, \ldots, 3300_M$. Quadrature frequency clock generation, quadrature correction, and the like are not needed.

Figure 4:
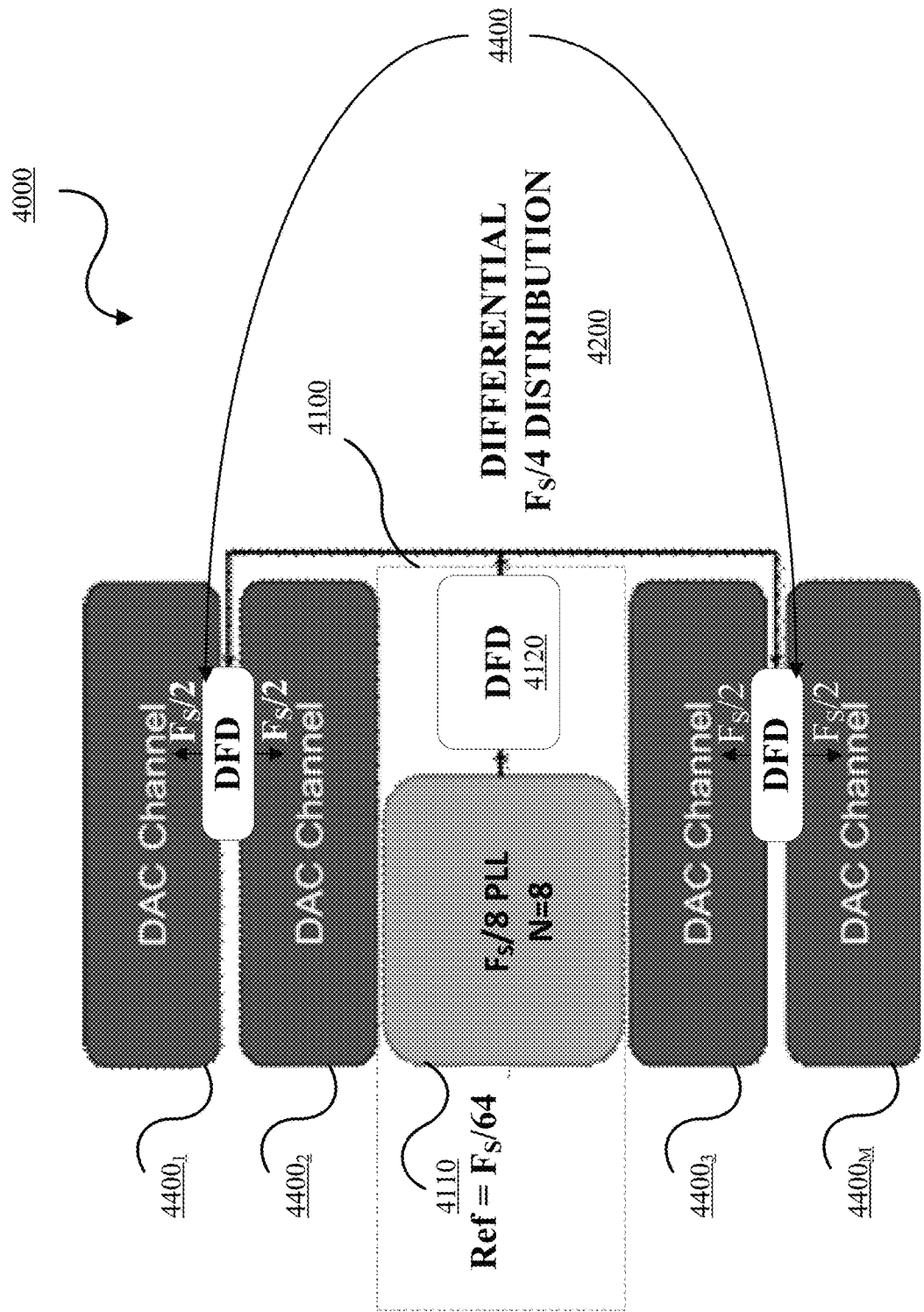
FIG. 4 is a block diagram of an example of a frequency clock generation and distribution architecture for a multi-channel high speed device in accordance with embodiments of this disclosure.

FIG. 4 is a block diagram of an example of a frequency clock generation and distribution architecture for a multi-channel high speed device 4000. In implementations, the multi-channel high speed device 4000 can be a multi-channel digital-to-analog converter (DAC), a multi-channel serializer, and the like. The multi-channel high speed device 4000 includes a frequency clock generation circuit 4100 which is connected to a frequency clock distribution circuit 4200, which in turn is connected to multiple data processing channels such as DAC channels $4300_1, 4300_2, \ldots, 4300_M$. The frequency clock generation circuit 4100 includes a PLL 4110 which operates at and generates a frequency clock from a reference clock (Ref) and a DFD 4120 which generates a doubled frequency clock. In implementations, the frequency clock is a $F_S/8$ frequency clock. Consequently, a divide ratio in the PLL 4110 is 8. In implementations, the frequency clock can be at least a $F_S/8$ or lower frequency clock. In implementations, the frequency clock can be at least a differential $F_S/8$ or lower frequency clock. In implementations, the reference clock is a high precision external reference clock.

The multi-channel high speed device 4000 further includes DFDs 4400 to generate the $F_S/2$ frequency clocks after clock distribution, which are then used by each of the data processing channels. In implementations, the DFDs 4400 enable local or near local frequency multiplication at the DAC channels $4300_1, 4300_2, \ldots, 4300_M$. In implementations, the frequency clock distribution circuit 4200 includes the DFDs 4400 so that multiple channels of the DAC channels $4300_1, 4300_2, \ldots, 4300_M$ can use one DFD 4400. In implementations, each of the DAC channels $4300_1, 4300_2, \ldots, 4300_M$ includes a DFD 4400.

Operationally, the PLL 4110 generates a differential $F_S/8$ frequency clock which is doubled by the DFD 4120 to output a differential $F_S/4$ frequency clock. The DFD 4120 multiplies the differential $F_S/8$ frequency clock inputs to output a single-ended $F_S/4$ frequency clock and then converts the single-ended $F_S/4$ frequency clock to a differential $F_S/4$ frequency clock for distribution by the frequency clock distribution circuit 4200. The DFDs 4400 multiply the differential $F_S/4$ frequency clock inputs to output a single-ended $F_S/2$ frequency clock and then convert the single-ended $F_S/2$ frequency clock to a differential $F_S/2$ frequency clock for use by the DAC channels $4300_1, 4300_2, \ldots, 4300_M$. Quadrature frequency clock generation, quadrature correction, and the like are not needed.

Figure 5:
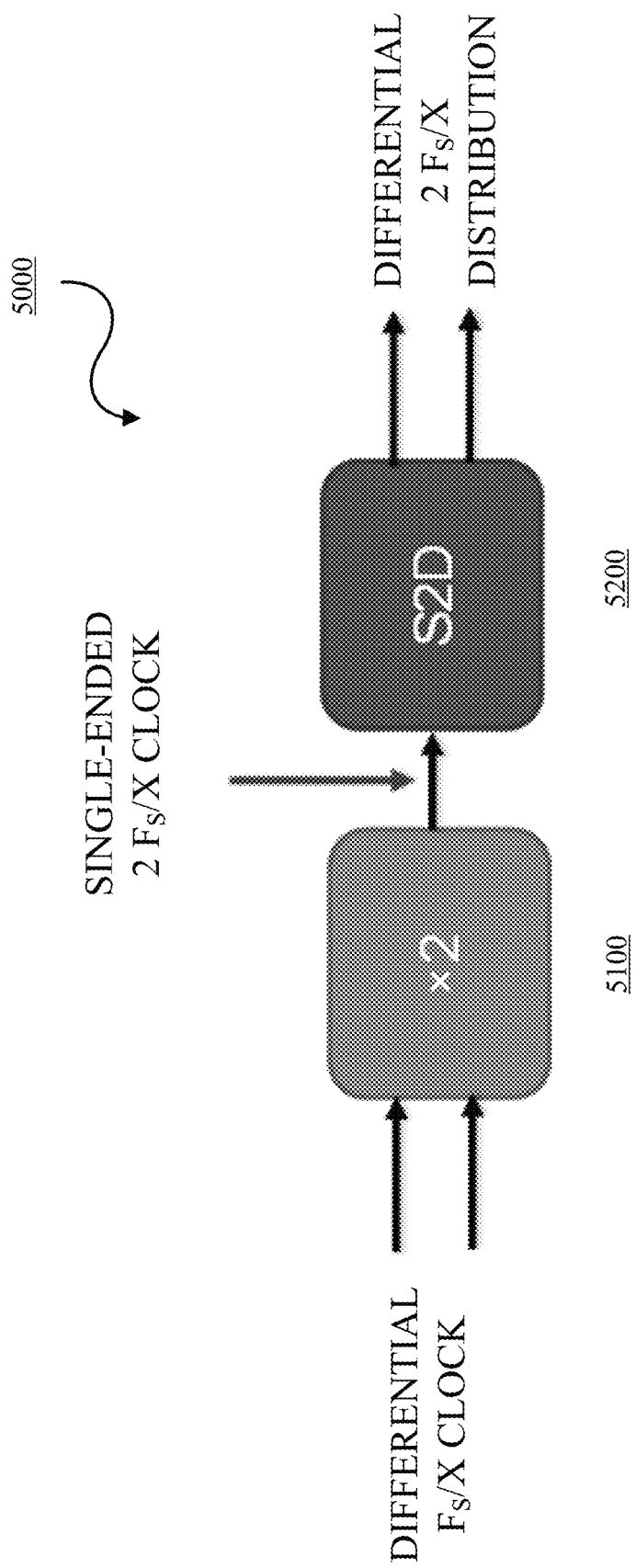
FIG. 5 is a block diagram of an example of a differential frequency doubler in accordance with embodiments of this disclosure.

FIG. 5 is a block diagram of an example of a DFD 5000 in accordance with embodiments of this disclosure. The DFD 5000 includes a multiplier or doubler 5100 connected to a S2D 5200. The DFD 5000 uses only differential clocks at the input of the doubler 5100 and produces a single-ended output running at twice the frequency of the differential clock inputs. The single-ended output is input to the S2D 5200 to produce the fully balanced outputs. The DFD 5000 only requires two phases (differential) inputs and produces differential outputs at twice the frequency. Consequently, the DFD 5000 does not need quadrature signals at the input.

Figure 6:
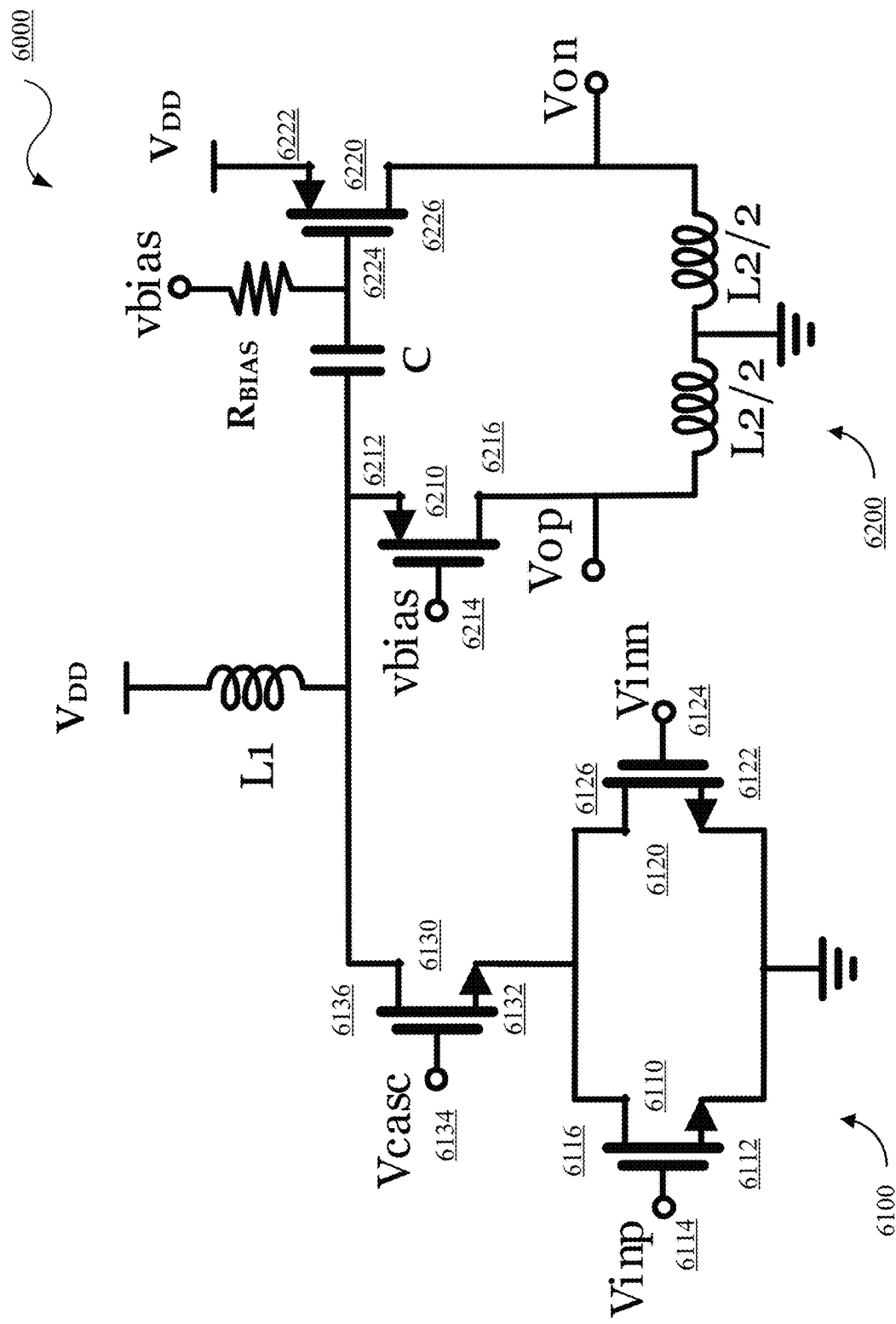
FIG. 6 is a block diagram of an example of a differential frequency doubler circuit in accordance with embodiments of this disclosure.

FIG. 6 is a block diagram of an example of a DFD circuit 6000 in accordance with embodiments of this disclosure. The DFD circuit 6000 includes a squarer circuit 6100 having inputs connected to a differential clock and an output connected to an input of a S2D converter circuit 6200 and a first end of an inductor $L_1$, which has a second end connected to $V_{DD}$. The squarer circuit 6100 is a n-channel metal-oxide semiconductor (NMOS) based circuit and the S2D converter circuit 6200 is a p-channel metal-oxide semiconductor (PMOS) based circuit.

The squarer circuit 6100 includes a first input NMOS transistor 6110, a second input NMOS transistor 6120, and a cascode NMOS transistor 6130. The first input NMOS transistor 6110 has a source 6112 connected to ground, a gate 6114 connected to $V_{IDD}$, and a drain 6116 connected to a source 6132 of the cascode NMOS transistor 6130. The second input NMOS transistor 6120 has a source 6122 connected to ground, a gate 6124 connected to $V_{INN}$, and a drain 6126 connected to the source 6132 of the cascode NMOS transistor 6130. The cascode NMOS transistor 6130 has a gate 6134 connected to $V_{CASCODE}$ and a drain 6136 connected to the first end of the inductor $L_1$.

The S2D converter circuit 6200 includes a capacitor C, a bias resistor $R_{BIAS}$, a first output PMOS transistor 6210, a second output PMOS transistor 6220, and an inductor $L_2$. The first end of the inductor $L_1$ is connected to a first end of the capacitor C and to a source 6212 of the first output PMOS transistor 6210. The first output PMOS transistor 6210 has a gate 6214 connected to $V_{BIAS}$ and a drain 6216 connected to a first end of the inductor $L_2$. The bias resistor $R_{BIAS}$ is connected to a second end of the capacitor C and to a gate 6224 of the second output PMOS transistor 6220. The second output PMOS transistor 6220 has a source 6222 connected to $V_{DD}$ and a drain 6226 connected to a second end of the inductor $L_2$. The inductor $L_2$ is tuned to a squared frequency by being tapped at a midpoint to ground. A differential output, $V_{OP}$ and $V_{ON}$, is obtained from the drain 6216 and the drain 6226, respectively.

Figure 7:
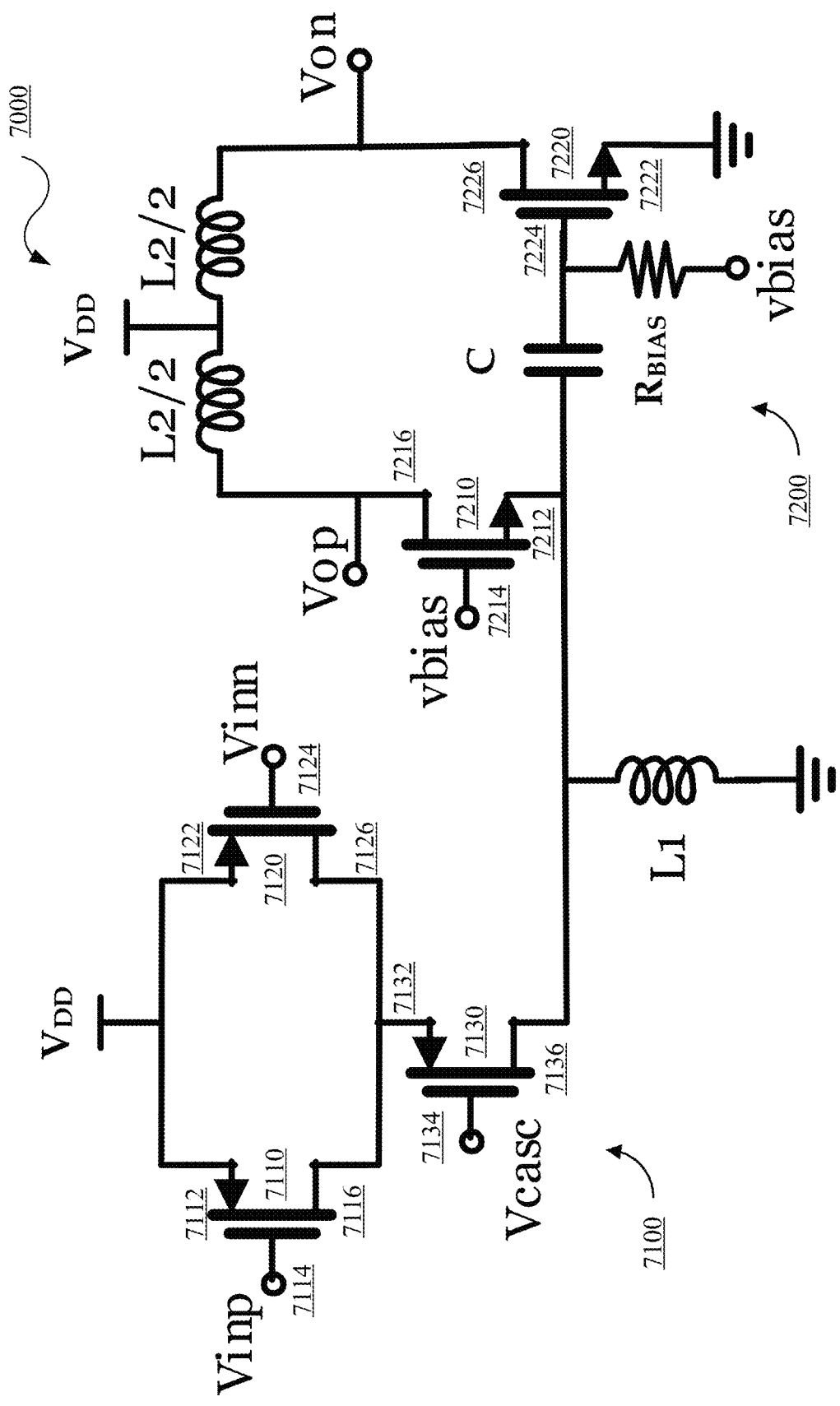
FIG. 7 is a block diagram of an example of a differential frequency doubler circuit in accordance with embodiments of this disclosure.

FIG. 7 is a block diagram of an example of a DFD circuit 7000 in accordance with embodiments of this disclosure. The DFD circuit 7000 includes a squarer circuit 7100 having inputs connected to a differential clock and an output connected to an input of a S2D converter circuit 7200 and a first end of an inductor $L_1$, which has a second end connected to ground. The squarer circuit 7100 is a PMOS based circuit and the S2D converter circuit 7200 is a NMOS based circuit.

The squarer circuit 7100 includes a first input PMOS transistor 7110, a second input PMOS transistor 7120, and a cascode PMOS transistor 7130. The first input PMOS transistor 7110 has a source 7112 connected to $V_{DD}$, a gate 7114 connected to $V_{INP}$, and a drain 7116 connected to a source 7132 of the cascode PMOS transistor 7130. The second input PMOS transistor 7120 has a source 7122 connected to $V_{DD}$, a gate 7124 connected to $V_{INN}$, and a drain 7126 connected to the source 7132 of the cascode PMOS transistor 7130. The cascode PMOS transistor 7130 has a gate 7134 connected to $V_{CASCODE}$ and a drain 7136 connected to the first end of the inductor $L_1$.

The S2D converter circuit 7200 includes a capacitor C, a bias resistor $R_{BIAS}$, a first output NMOS transistor 7210, a second output NMOS transistor 7220, and an inductor $L_2$. The first end of the inductor $L_1$ is connected to a first end of the capacitor C and to a source 7212 of the first output NMOS transistor 7210. The first output NMOS transistor 7210 has a gate 7214 connected to $V_{BIAS}$ and a drain 7216 connected to a first end of the inductor $L_2$. The bias resistor $R_{BIAS}$ is connected to a second end of the capacitor C and to a gate 7224 of the second output NMOS transistor 7220. The second output NMOS transistor 7220 has a source 7222 connected to ground and a drain 7226 connected to a second end of the inductor $L_2$. The inductor $L_2$ is tuned to a squared frequency by being tapped at a midpoint to ground. A differential output, $V_{OP}$ and $V_{ON}$, is obtained from the drain 7216 and the drain 7226, respectively.

Referring now to both FIG. 6 and FIG. 7, differential clocks at the input enter the squarer circuit 6100 (7100) and the single-ended output of the squarer circuit 6100 (7100) is folded back into the S2D converter circuit 6200 (7200) to generate the differential output. The single-ended output is immune from any common-mode noises. Prior art current frequency doublers do not provide differential outputs based on differential inputs and require quadrature inputs to generate differential outputs. The requirement of quadrature inputs necessitates the use of mixed NMOS and PMOS transistors to generate the complementary signals comprising the quadrature inputs. As noted herein, each of the squarer circuit 6100, the S2D converter circuit 6200, the squarer circuit 7100, and the S2D converter circuit 7200 use either NMOS or PMOS transistors. Consequently, the differential output is not sensitive to PMOS/NMOS matching.

In both of the circuits of FIG. 6 and FIG. 7, the generated two differential phases at the output (squarer or doubler outputs) move together over process corners and are not sensitive to the process variation of NMOS and PMOS. In implementations, the circuits of FIG. 6 and FIG. 7 are insensitive to FS (NMOS=fast, PMOS=slow) and SF (NMOS=slow, PMOS=fast). In these conditions the output of the NMOS-based circuits will be faster/slower compared to the output of the PMOS-based output. The drawback of relying on both (mixed) NMOS and PMOS devices to generate differential signals is that it creates significant asymmetry between the differential outputs over process corners. When the PMOS and NMOS devices differ in speed and/or transducer gain, the differential outputs are skewed in time with respect to each other, the amplitudes are mismatched and, the duty cycle distortion (DCD) of the outputs degrade switching performance of a final interleaving multiplexor stage in the DAC.

Figure 8:
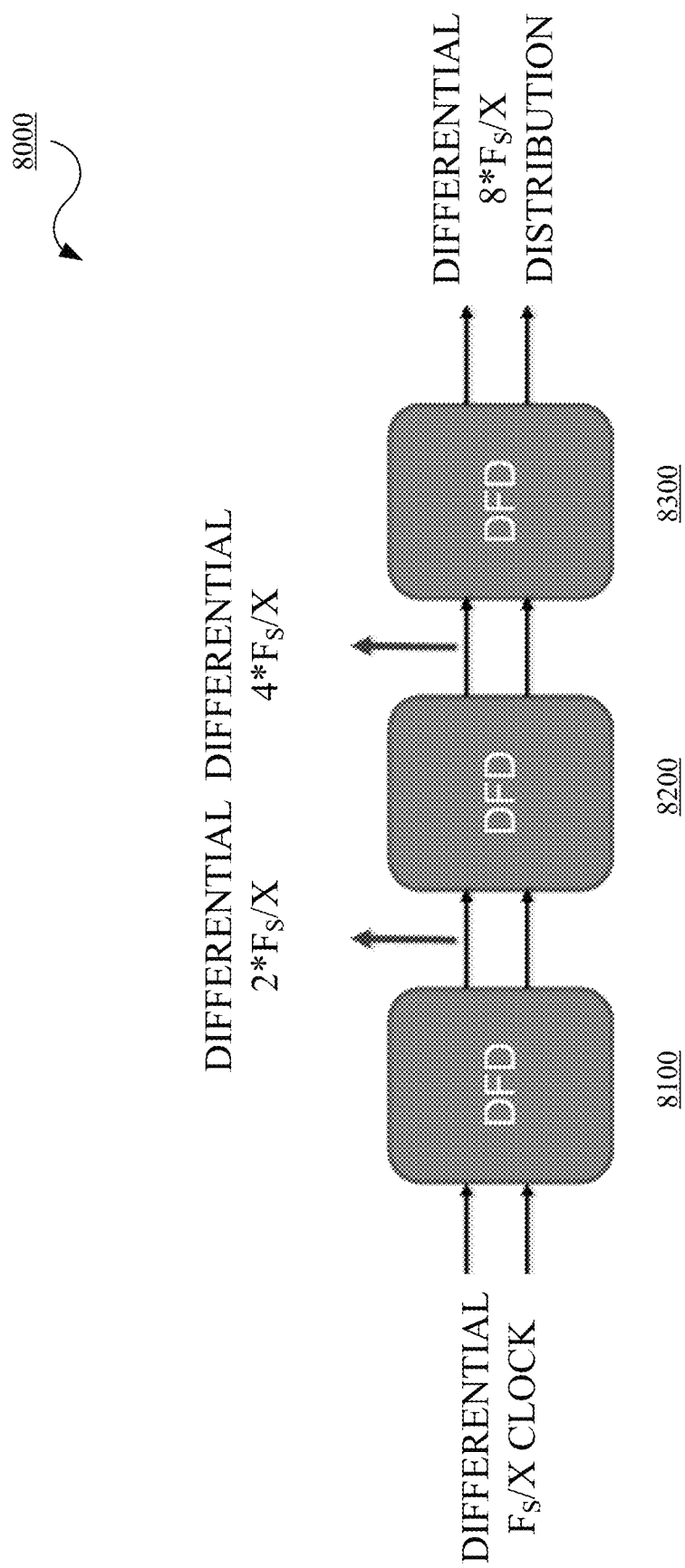
FIG. 8 is a block diagram of an example of a low power frequency clock generation circuit in accordance with embodiments of this disclosure.

FIG. 8 is a block diagram of an example of a low power frequency generation circuit 8000 in accordance with embodiments of this disclosure. In implementations, the DFD described herein enables use of PLLs at a low frequency and subsequent low frequency distribution. The low power frequency generation circuit 8000 includes multiple DFDs 8100, 8200, and 8300 which enable a PLL to operate at and generate a differential $F_S/X$ frequency clock. The DFD 8100 processes the differential $F_S/X$ frequency clock to generate a differential $2*F_S/X$ frequency clock as described herein. The DFD 8200 processes the differential $2*F_S/X$ frequency clock to generate a differential $4*F_S/X$ frequency clock as described herein. The DFD 8300 processes the differential $4*F_S/X$ frequency clock to generate a differential $8*F_S/X$ frequency clock as described herein. In implementations, one or more of the DFDs 8100, 8200, and 8300 can be located and connected as part of a clock generation circuit, as part of a clock distribution circuit, or combinations thereof as described herein. In implementations, any of the differential clock frequencies can be distributed to data processing channels. In implementations, the differential $2*F_S/X$ clock frequency is distributed to data processing channels. In implementations, the differential $4*F_S/X$ clock frequency is distributed to data processing channels. The number of DFDs is illustrative and any number of DFDs can be used without departing from the scope of the specification and claims.

Figure 9:
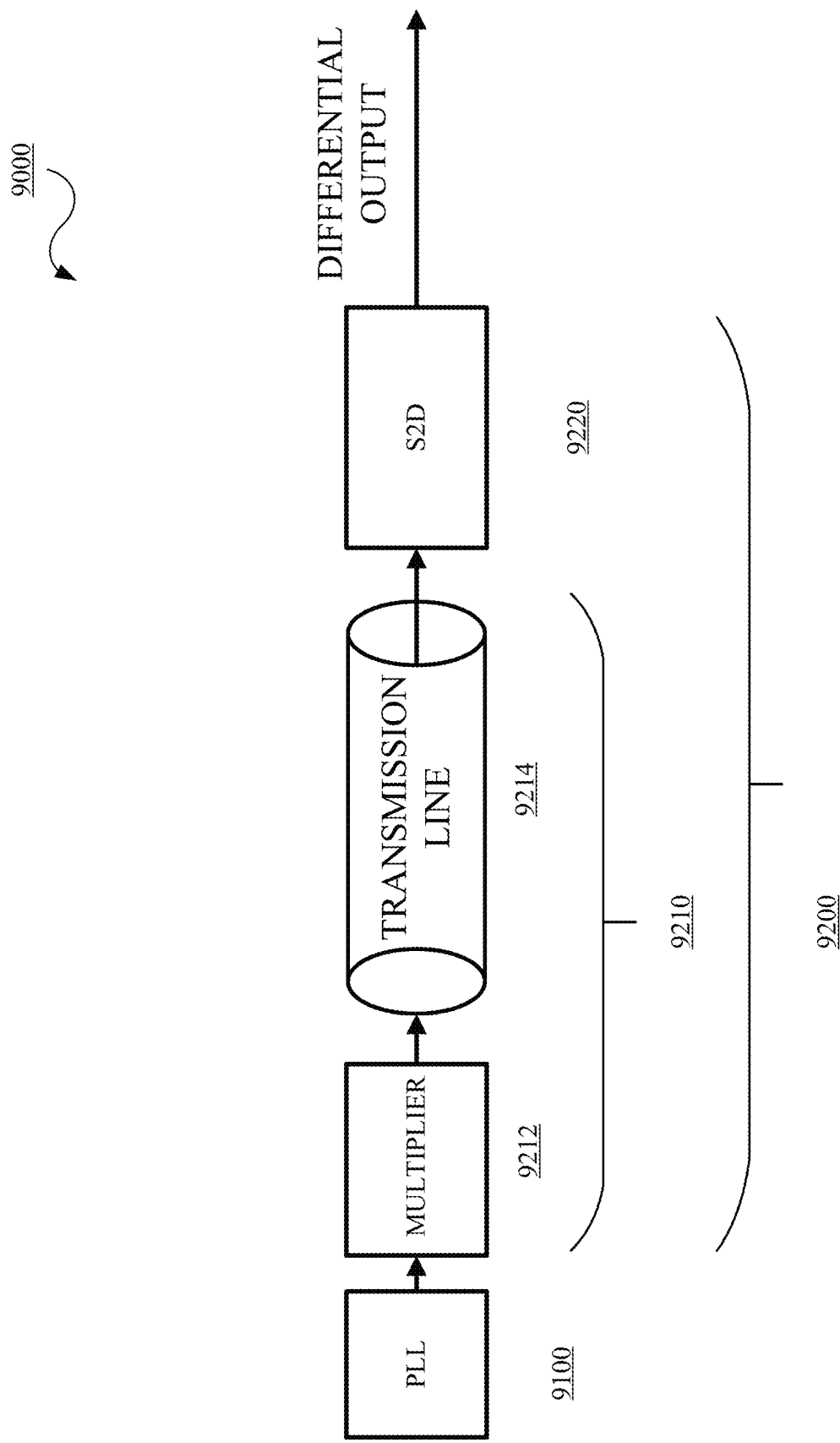
FIG. 9 is a block diagram of an example of a single-ended frequency clock generation and distribution circuit in accordance with embodiments of this disclosure.

FIG. 9 is a block diagram of an example of a single-ended clock generation and distribution circuit 9000 in accordance with embodiments of this disclosure. The single-ended clock generation and distribution circuit 9000 includes a PLL 9100 connected to a distributed or distributive DFD 9200. The distributed or distributive DFD 9200 includes a single-ended clock distribution circuit 9210 and a S2D 9220. The single-ended clock distribution circuit 9210 includes a multiplier 9212 and a transmission line 9214. The S2D 9220 can provide impedance matching for the transmission line 9214.

A frequency clock is generated at the PLL, which is then multiplied by the multiplier 9212 to generate a single-ended frequency clock. The single-ended frequency clock is distributed or transmitted via the transmission line 9214 from the multiplier 9212 to the S2D 9220 at a transmission line termination. The S2D 9220 converts the single-ended frequency clock to a differential frequency clock. The multiplier 9212 and the S2D 9220 of the distributed or distributive DFD 9200 operate as described herein. The single-ended clock generation and distribution circuit 9000 can reduce clock distribution power consumption.

FIG. 10 is a block diagram of an example of a single-ended clock generation and distribution circuit 10000 in accordance with embodiments of this disclosure. The single-ended clock generation and distribution circuit 10000 includes a multiplier 10100, a transmission line 10200, and a S2D 10300. The single-ended clock generation and distribution circuit 10000 functions and operates as described herein.

A $F_S/4$ frequency clock is generated by a PLL, which is then multiplied by the multiplier 10100 to generate a single-ended $F_S/2$ frequency clock. The single-ended $F_S/2$ frequency clock is distributed or transmitted via the transmission line 10200 from the multiplier 10100 to the S2D 10300 at a transmission line termination. The S2D 10300 converts the single-ended $F_S/2$ frequency clock to a differential $F_S/2$ frequency clock, which is then distributed for use by data processing channels.

FIG. 11 is a block diagram of an example of a single-ended clock generation and distribution circuit 11000 in accordance with embodiments of this disclosure. The single-ended clock generation and distribution circuit 11000 includes a multiplier 11100, a transmission line 11200, and a S2D 11300. The single-ended clock generation and distribution circuit 11000 functions and operates as described herein.

A $F_S/8$ frequency clock is generated by a PLL, which is then multiplied by the multiplier 11100 to generate a single-ended $F_S/4$ frequency clock. The single-ended $F_S/4$ frequency clock is distributed or transmitted via the transmission line 11200 from the multiplier 11100 to the S2D 11300 at a transmission line termination. The S2D 11300 converts the single-ended $F_S/4$ frequency clock to a differential $F_S/4$ frequency clock, which is then distributed for use by data processing channels.

FIG. 12 is a block diagram of an example of a single-ended clock generation and distribution circuit 12000 in accordance with embodiments of this disclosure. The single-ended clock generation and distribution circuit 12000 includes a multiplier 12100, a transmission line 12200, and a S2D 12300. The single-ended clock generation and distribution circuit 12000 functions and operates as described herein.

A $F_S/16$ frequency clock is generated by a PLL, which is then multiplied by the multiplier 12100 to generate a single-ended $F_S/8$ frequency clock. The single-ended $F_S/8$ frequency clock is distributed or transmitted via the transmission line 12200 from the multiplier 12100 to the S2D 12300 at a transmission line termination. The S2D 12300 converts the single-ended $F_S/8$ frequency clock to a differential $F_S/8$ frequency clock, which is then distributed for use by data processing channels.

Figure 13:
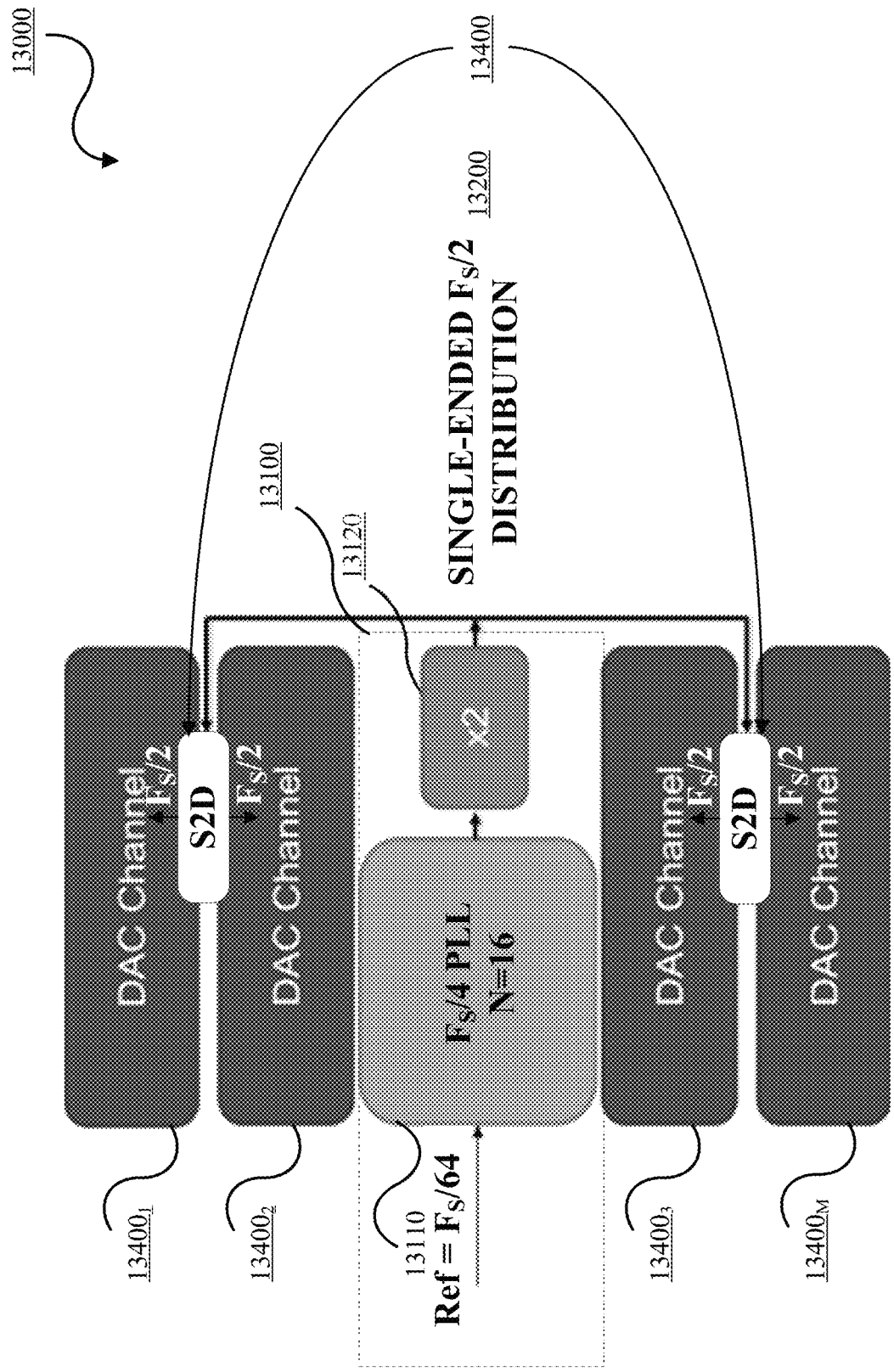
FIG. 13 is a block diagram of an example of a frequency clock generation and distribution architecture for a multi-channel high speed device.

FIG. 13 is a block diagram of an example of a frequency clock generation and distribution architecture for a multi-channel high speed device 13000. In implementations, the multi-channel high speed device 13000 can be a multi-channel digital-to-analog converter (DAC), a multi-channel serializer, and the like. The multi-channel high speed device 13000 includes a frequency clock generation circuit 13100 which is connected to a clock distribution circuit 13200, which in turn is connected to multiple data processing channels such as DAC channels $\mathbf{13300_1}, \mathbf{13300_2}, \ldots, \mathbf{13300_M}$. The frequency clock generation circuit 13100 includes a PLL 13110 which operates at and generates a frequency clock from a reference clock (Ref) and a multiplier 13120 which generates a doubled frequency clock. In implementations, the clock distribution circuit 13200 includes S2Ds 13400 at or near distribution end point. In implementations, multiples of the DAC channels $\mathbf{13300_1}, \mathbf{13300_2}, \ldots, \mathbf{13300_M}$ are connected to one of the S2Ds 13400. In implementations, each of the DAC channels $\mathbf{13300_1}, \mathbf{13300_2}, \ldots, \mathbf{13300_M}$ can include a S2D 13400. In implementations, the multiplier 13120 and the S2Ds 13400 constitute a distributed DFD as described herein. In implementations, the frequency clock is a $F_S/4$ frequency clock. Consequently, a divide ratio in the PLL 13110 is 16. In implementations, the reference clock is a high precision external reference clock.

Operationally, the PLL 13110 generates a differential $F_S/4$ frequency clock which is doubled by the multiplier 13120 to output a single-ended $F_S/2$ frequency clock for distribution by the clock distribution circuit 13200. The S2Ds 13400 convert the single-ended $F_S/2$ frequency clock to a differential $F_S/2$ frequency clock for use by the DAC channels $\mathbf{13300_1}, \mathbf{13300_2}, \ldots, \mathbf{13300_M}$.

Figure 14:
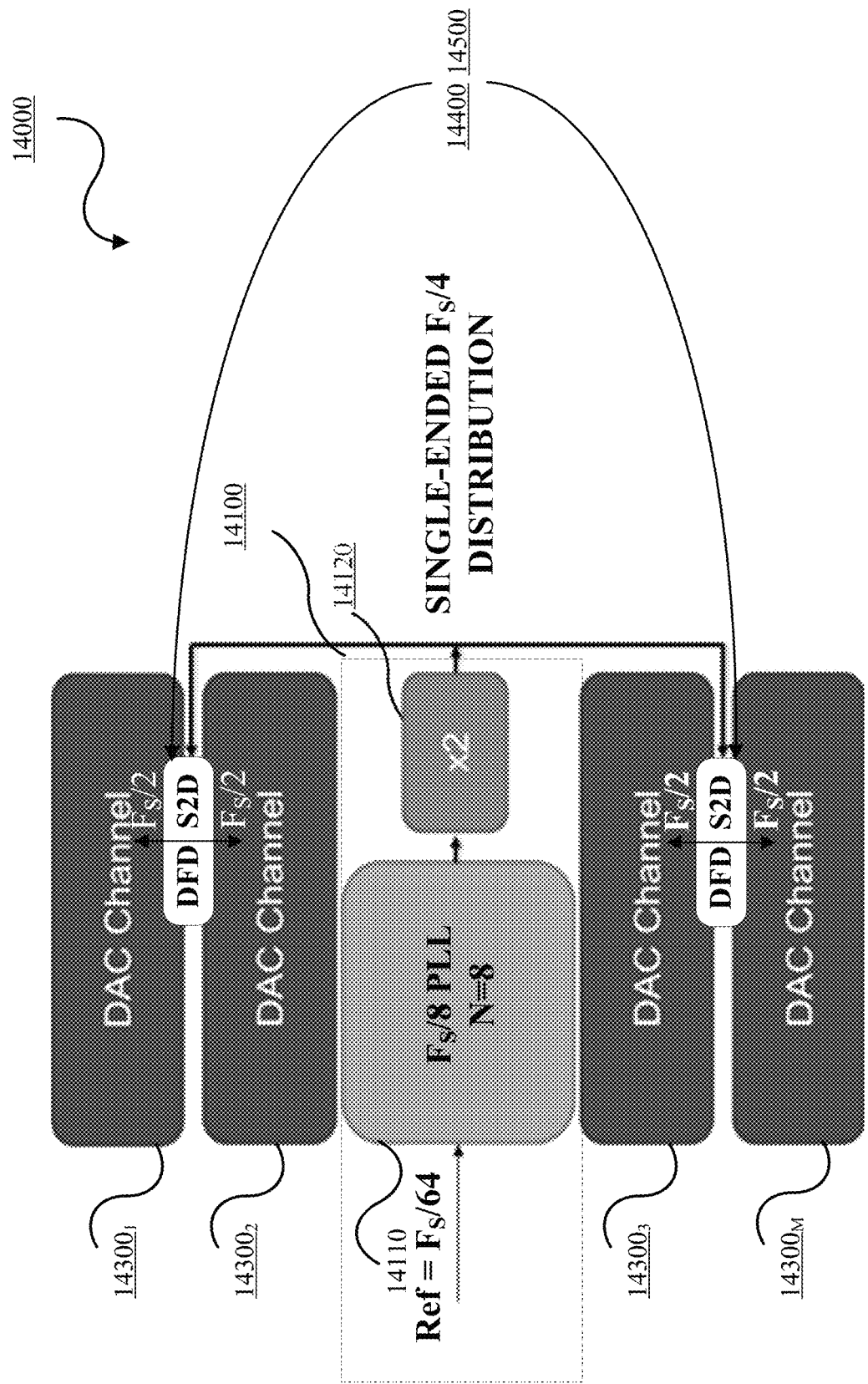
FIG. 14 is a block diagram of an example of a frequency clock generation and distribution architecture for a multi-channel high speed device.

FIG. 14 is a block diagram of an example of a frequency clock generation and distribution architecture for a multi-channel high speed device. In implementations, the multi-channel high speed device 14000 can be a multi-channel digital-to-analog converter (DAC), a multi-channel serializer, and the like. The multi-channel high speed device 14000 includes a frequency clock generation circuit 14100 which is connected to a frequency clock distribution circuit 14200, which in turn is connected to multiple data processing channels such as DAC channels $\mathbf{14300_1}, \mathbf{14300_2}, \ldots, \mathbf{14300_M}$. The frequency clock generation circuit 14100 includes a PLL 14110 which operates at and generates a frequency clock from a reference clock (Ref) and a multiplier 14120 which generates a doubled frequency clock. In implementations, the frequency clock distribution circuit 14200 includes S2Ds 14400 at or near the distribution end point and DFDs 14500 at or near the distribution end point. In implementations, multiples of the DAC channels $\mathbf{14300_1}, \mathbf{14300_2}, \ldots, \mathbf{14300_M}$ are connected to one of the DFDs 14500. In implementations, each of the DAC channels $\mathbf{14300_1}, \mathbf{14300_2}, \ldots, \mathbf{14300_M}$ can include a S2D 14400 and a DFD 14500. In implementations, the multiplier 14120, the S2Ds 14400, and the DFDs 14500 constitute a distributed DFD as described herein. In implementations, the frequency clock is a $F_S/8$ frequency clock. Consequently, a divide ratio in the PLL 14110 is 8, which can improve performance of the PLL. In implementations, the reference clock is a high precision external reference clock.

Operationally, the PLL 14110 generates a differential $F_S/8$ frequency clock which is doubled by the multiplier 14120 to output a single-ended $F_S/4$ frequency clock for distribution by the frequency clock distribution circuit 14200. The S2Ds 14400 convert the single-ended $F_S/4$ frequency clock to a differential $F_S/4$ frequency clock and the DFDs 14500 convert the differential $F_S/4$ frequency clock to a differential $F_S/2$ frequency clock for use by the DAC channels $\mathbf{14300_1}, \mathbf{14300_2}, \ldots, \mathbf{14300_M}$.

Figure 15:
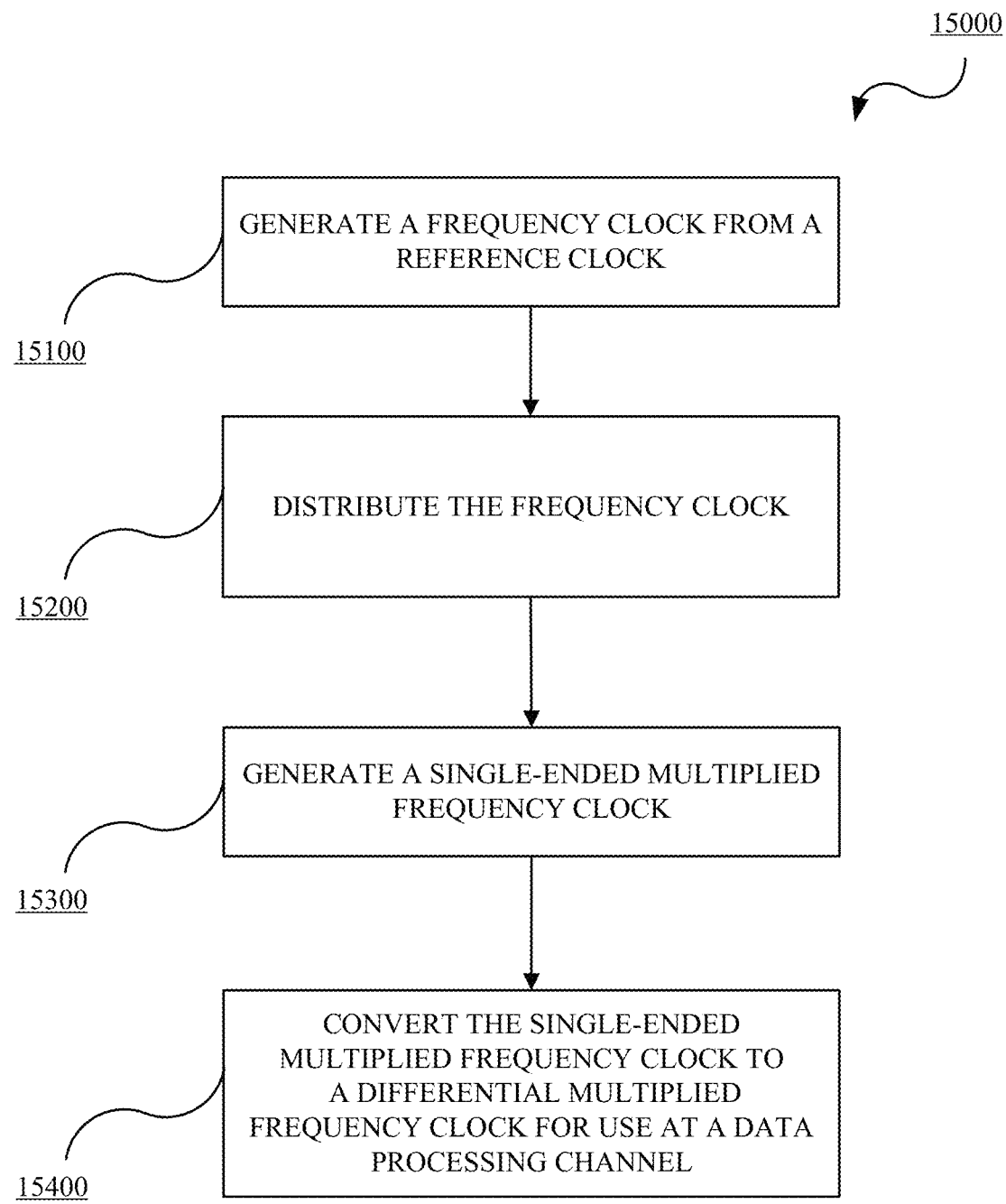
FIG. 15 is a flowchart of an example technique for low power frequency clock generation and distribution in accordance with embodiments of this disclosure.

FIG. 15 is a flowchart of an example method 15000 for low power frequency clock generation and distribution in accordance with embodiments of this disclosure. The method includes: generating 15100 a frequency clock from a reference clock; distributing 15200 the frequency clock; generating 15300 a single-ended multiplied frequency clock from the distributed frequency clock; and converting 15400 the single-ended multiplied frequency clock to a differential multiplied frequency clock for use at a data processing channel. The method 15000 can be implemented by the multi-channel high speed device 3000, the frequency clock generation circuit 3100, the frequency clock distribution circuit 3200, the multiple DAC channels $\mathbf{3300_1}, \mathbf{3300_2}, \ldots, \mathbf{3300_M}$, the multi-channel high speed device 4000, the frequency clock generation circuit 4100, the frequency clock distribution circuit 4200, the DAC channels $\mathbf{4300_1}, \mathbf{4300_2}, \ldots, \mathbf{4300_M}$, the DFD 5000, the DFD circuit 6000, the DFD circuit 7000, the low power frequency generation circuit 8000, the single-ended clock generation and distribution circuit 9000, the single-ended clock generation and distribution circuit 10000, the single-ended clock generation and distribution circuit 11000, the single-ended clock generation and distribution circuit 12000, the multi-channel high speed device 13000, the frequency clock generation circuit 13100, the clock distribution circuit 13200, the DAC channels $\mathbf{13300_1}, \mathbf{13300_2}, \ldots, \mathbf{13300_M}$, the multi-channel high speed device 14000, the frequency clock generation circuit 14100, the frequency clock distribution circuit 14200, and the DAC channels $\mathbf{14300_1}, \mathbf{14300_2}, \ldots, \mathbf{14300_M}$, as appropriate and applicable.

The method 15000 includes generating 15100 a frequency clock from a reference clock. A PLL generates a frequency clock from a reference clock. The frequency clock can be a $F_S/4$, $F_S/8$, $F_S/16$, or lower frequency clock. In implementations, generating can include differential frequency doubling the frequency clock from the PLL.

The method 15000 includes distributing 15200 the frequency clock. The output of the PLL is distributed toward the data processing channels. In implementations, the output of a DFD is distributed toward the data processing channels.

The method 15000 includes generating 15300 a single-ended multiplied frequency clock from the distributed frequency clock. The distributed frequency clock is processed through a multiplier which generates the single-ended multiplied frequency clock.

The method 15000 includes converting 15400 the single-ended multiplied frequency clock to a differential multiplied frequency clock for use at a data processing channel. The single-ended multiplied frequency clock is processed through a converter which generates the differential multiplied frequency clock. The differential multiplied frequency clock can be used by the data processing channels.

Figure 16:
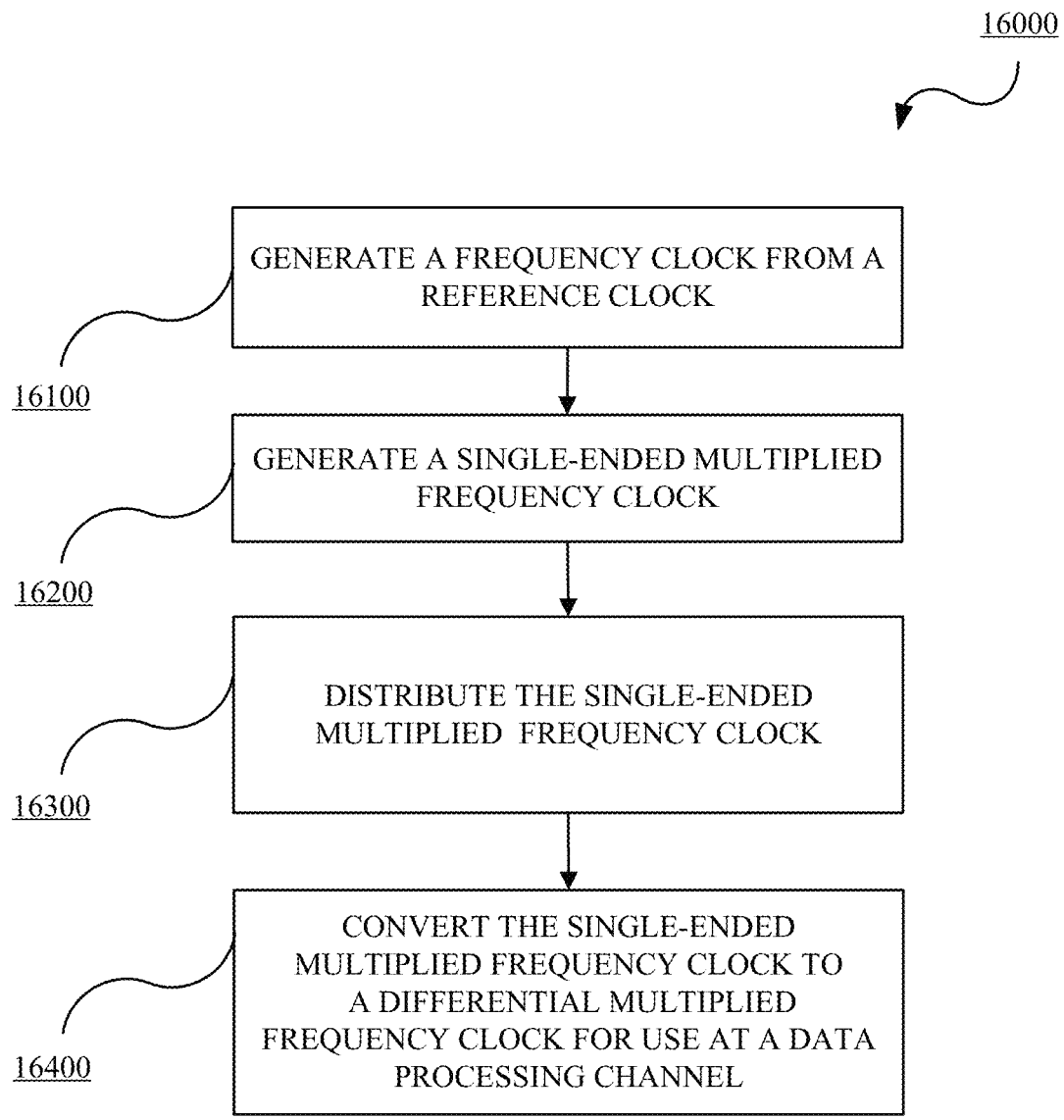
FIG. 16 is a flowchart of an example technique for low power frequency clock generation and distribution in accordance with embodiments of this disclosure.

FIG. 16 is a flowchart of an example method 16000 for low power frequency clock generation and distribution in accordance with embodiments of this disclosure. The method includes: generating 16100 a frequency clock from a reference clock; generating 16200 a single-ended multiplied frequency clock from the frequency clock; distributing 16300 the single-ended multiplied frequency clock; and converting 16400 the single-ended multiplied frequency clock to a differential multiplied frequency clock for use at a data processing channel. The method 16000 can be implemented by the multi-channel high speed device 3000, the frequency clock generation circuit 3100, the frequency clock distribution circuit 3200, the multiple DAC channels 3300₁, 3300₂, . . . , 3300_M, the multi-channel high speed device 4000, the frequency clock generation circuit 4100, the frequency clock distribution circuit 4200, the DAC channels 4300₁, 4300₂, . . . , 4300_M, the DFD 5000, the DFD circuit 6000, the DFD circuit 7000, the low power frequency generation circuit 8000, the single-ended clock generation and distribution circuit 9000, the single-ended clock generation and distribution circuit 10000, the single-ended clock generation and distribution circuit 11000, the single-ended clock generation and distribution circuit 12000, the multi-channel high speed device 13000, the frequency clock generation circuit 13100, the clock distribution circuit 13200, the DAC channels 13300₁, 13300₂, . . . , 13300_M, the multi-channel high speed device 14000, the frequency clock generation circuit 14100, the frequency clock distribution circuit 14200, and the DAC channels 14300₁, 14300₂, . . . , 14300_M, as appropriate and applicable.

The method 16000 includes generating 16100 a frequency clock from a reference clock. A PLL generates a frequency clock from a reference clock. The frequency clock can be a $F_S/4$, $F_S/8$, $F_S/16$, or lower frequency clock.

The method 16000 includes generating 16200 a single-ended multiplied frequency clock from the frequency clock. The frequency clock is processed through a multiplier which generates the single-ended multiplied frequency clock.

The method 16000 includes distributing 16300 the single-ended multiplied frequency clock. The output of the multiplier is distributed toward the data processing channels.

The method 16000 includes converting 16400 the single-ended multiplied frequency clock to a differential multiplied frequency clock for use at a data processing channel. The single-ended multiplied frequency clock is processed through a converter which generates the differential multiplied frequency clock. The differential multiplied frequency clock can be used by the data processing channels.

Although some embodiments herein refer to methods, it will be appreciated by one skilled in the art that they may also be embodied as a system or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "processor," "device," or "system." Furthermore, aspects of the present invention may take the form of a computer program product embodied in one or more the computer readable mediums having the computer readable program code embodied thereon. Any combination of one or more computer readable mediums may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to CDs, DVDs, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures.

While the disclosure has been described in connection with certain embodiments, it is to be understood that the disclosure is not to be limited to the disclosed embodiments but, on the contrary, is intended to cover various modifications, combinations, and equivalent arrangements included within the scope of the appended claims, which scope is to be accorded the broadest interpretation so as to encompass all such modifications and equivalent structures as is permitted under the law.

What is claimed is:

1. A device comprising:
a low power generation circuit configured to generate a differential 1/N sampling frequency (Fs/N) clock, wherein N is larger than 2; and
a differential frequency doubler configured to
generate a single-ended multiplied frequency clock from the differential 1/N sampling frequency (Fs/N) clock; and
convert the single-ended multiplied frequency clock to a differential multiplied frequency clock for use by one or more data processing channels.

2. The device of claim 1, wherein the differential frequency doubler comprises a squarer circuit implemented with one of a first transistor type or a second transistor type and a converter circuit implemented with a remaining one of the first transistor type or the second transistor type.

3. The device of claim 1, wherein the differential frequency doubler comprises a squarer circuit implemented with one of a n-type metal-oxide-semiconductor (NMOS) transistor or a p-type metal-oxide-semiconductor (PMOS) transistor and a converter circuit implemented with a remaining one of the NMOS transistor or the PMOS transistor.

4. The device of claim 1, wherein the differential frequency doubler is integrated with a data processing channel.

5. The device of claim 1, wherein the differential frequency doubler is implemented at a terminal end of the low power generation circuit to feed multiple data processing channels.

6. The device of claim 1, wherein the low power generation circuit comprises another differential frequency doubler configured to generate a single-ended multiplied frequency clock from a differential Fs/M clock and convert the single-ended multiplied frequency clock based on the differential Fs/M clock to the differential 1/N sampling frequency (Fs/N) clock, wherein M is greater than N.

7. The device of claim 6, wherein the low power generation circuit further comprises a phase locked loop operating at one of the differential 1/N sampling frequency (Fs/N) clock or the differential Fs/M clock, the phase locked loop configured to generate the differential 1/N sampling frequency (Fs/N) clock or the differential Fs/M clock from a reference clock.

8. The device of claim 1, wherein the differential frequency doubler is multiple differential frequency doublers.

9. A method for low power clock generation and distribution, the method comprising:
generating, by a clock generation circuit of a data processing device, a differential 1/N sampling frequency (Fs/N) clock, wherein N is larger than 2;
distributing, by a clock distribution circuit of the data processing device, the differential 1/N sampling frequency (Fs/N) clock;
generating, by a squarer circuit, a single-ended frequency clock from the distributed differential 1/N sampling frequency (Fs/N) clock; and
converting, by a converter, the single-ended frequency clock to a differential frequency clock for use at a data processing channel of the data processing device.

10. The method of claim 9, further comprising implementing the squarer circuit with one of a first transistor type or a second transistor type; and
implementing the converter with a remaining one of the first transistor type or the second transistor type.

11. The method of claim 9, further comprising
implementing the squarer circuit with one of a n-type metal-oxide-semiconductor (NMOS) transistor or a p-type metal-oxide-semiconductor (PMOS) transistor; and
implementing the converter with a remaining one of the n-type metal-oxide-semiconductor (NMOS) transistor or the p-type metal-oxide-semiconductor (PMOS) transistor.

12. The method of claim 9, further comprising implementing the squarer circuit and the converter in the data processing channel.

13. The method of claim 9, the generating by the clock generation circuit further comprises
generating a single-ended frequency clock from a differential Fs/M clock; and
converting the single-ended frequency clock based on the differential Fs/M clock to the differential 1/N sampling frequency (Fs/N) clock, wherein M is greater than N.

14. The method of claim 13, the generating by the clock generation circuit further comprises generating, by a phase locked loop, one of the differential 1/N sampling frequency (Fs/N) clock or the differential Fs/M clock from a reference clock.

15. A device comprising:
a clock generation circuit configured to generate a differential 1/N sampling frequency (Fs/N) clock, wherein N is larger than 2;
a squarer circuit configured to generate a single-ended frequency clock from the differential 1/N sampling frequency (Fs/N) clock;
a clock distribution circuit configured to distribute the single-ended frequency clock; and
a converter configured to convert the distributed single-ended frequency clock to a differential frequency clock for use at a data processing channel of the data processing device.

16. The device of claim 15, wherein the squarer circuit comprises one of a first transistor type or a second transistor type, and the converter comprises a remaining one of the first transistor type or the second transistor type.

17. The device of claim 15, wherein the squarer circuit comprises one of a n-type metal-oxide-semiconductor (NMOS) transistor or a p-type metal-oxide-semiconductor (PMOS) transistor, and the converter comprises a remaining one of the n-type metal-oxide-semiconductor (NMOS) transistor or the p-type metal-oxide-semiconductor (PMOS) transistor.

18. The device of claim 15, wherein the squarer circuit is implemented at the clock generation circuit, and the converter is implemented at one of a terminal point of the clock distribution circuit or the data processing channel.

19. The device of claim 15, wherein the clock generation circuit is further configured to
- generate a single-ended frequency clock from a differential Fs/M clock; and
- convert the single-ended frequency clock based on the differential Fs/M clock to the differential 1/N sampling frequency (Fs/N) clock, wherein M is greater than N.

20. The device of claim 19, wherein the clock generation circuit further comprises a phase locked loop configured to generate one of the differential 1/N sampling frequency (Fs/N) clock or the differential Fs/M clock from a reference clock.

* * * * *